United States Patent
Kazama

(10) Patent No.: US 8,742,394 B2
(45) Date of Patent: *Jun. 3, 2014

(54) SEMICONDUCTOR LIGHT-EMITTING ELEMENT

(75) Inventor: Takuya Kazama, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/550,968

(22) Filed: Jul. 17, 2012

(65) Prior Publication Data

US 2013/0020552 A1 Jan. 24, 2013

(30) Foreign Application Priority Data

Jul. 21, 2011 (JP) .................................. 2011-160060

(51) Int. Cl.
*H01L 33/14* (2010.01)
*H01L 33/38* (2010.01)

(52) U.S. Cl.
CPC ...................................... *H01L 33/38* (2013.01)
USPC .............. 257/13; 257/E33.008; 257/E33.062; 257/E33.011; 257/E33.072

(58) Field of Classification Search
CPC ....................................................... H01L 33/00
USPC ........... 257/13, 21–22, 40, 79–82, 84–86, 88, 257/91, 94, 96, 98, 99, 103, 918, 431, 432, 257/E21.351, E21.064, E21.047, E21.046, 257/E29.148, E29.143
See application file for complete search history.

(56) References Cited

U.S. PATENT DOCUMENTS

2009/0072257 A1* 3/2009 Unno et al. ..................... 257/98
2010/0207146 A1* 8/2010 Iizuka et al. ..................... 257/98
2012/0305889 A1* 12/2012 Lim et al. ......................... 257/13
2013/0037839 A1 2/2013 Kazama

FOREIGN PATENT DOCUMENTS

| JP | 2007-227895 A | 9/2007 |
| JP | 2008-060331 A | 3/2008 |
| JP | 2010-192709 A | 9/2010 |

OTHER PUBLICATIONS

U.S. Appl. No. 13/567,202; First Named Inventor: Takuya Kazama; Title: "Semiconductor Light Emitting Element", Filed: Aug. 6, 2012.

* cited by examiner

*Primary Examiner* — Chuong A Luu
*Assistant Examiner* — Moazzam Hossain
(74) *Attorney, Agent, or Firm* — Holtz Holtz Goodman & Chick PC

(57) ABSTRACT

A semiconductor light-emitting element includes a support substrate, a semiconductor film including a light-emitting layer provided on the support substrate, a surface electrode provided on a light-extraction-surface-side surface of the semiconductor film, and a light-reflecting layer provided between the support substrate and the semiconductor film, forming a light-reflecting surface. The surface electrode includes a first electrode piece and a second electrode piece. The light-reflecting layer includes a reflection electrode including a third electrode piece and a fourth electrode piece. The first electrode piece and the third electrode piece are arranged so as to not overlap when projected onto a projection surface parallel to a principal surface of the semiconductor film, and the shortest distance between the first electrode piece and the fourth electrode piece, is greater than the shortest distance between the first electrode piece and the third electrode piece.

8 Claims, 10 Drawing Sheets

SEMICONDUCTOR LIGHT-EMITTING ELEMENT

TECHNICAL FIELD

The invention relates to semiconductor light-emitting elements such as light-emitting diodes (LEDs).

DESCRIPTION OF THE RELATED ART

An LED configured using an AlGaInP-based material has a light-emitting layer having a larger band gap than that of a GaAs substrate used for crystal growth. Therefore, with regards to light radiated from the light-emitting layer, some of the light heading towards the light-extraction-surface side can be extracted, but light heading towards the GaAs-substrate side is absorbed by the GaAs substrate. There is known, as an element structure that can resolve a problem of such description, a "laminated" structure in which a light-reflecting film is formed on a surface of a semiconductor film opposite the light-extraction surface. A light-emitting element of such description is manufactured by, e.g., forming a semiconductor film made from an AlGaInP-based material on a GaAs substrate, then providing a light-reflecting film made of a metal having a high reflectivity on a surface of the semiconductor film, pasting a support substrate on the light-reflecting film, and then removing the GaAs substrate. According to an LED of such configuration, light heading towards a side opposite the light-extraction surface is reflected by the light-reflecting film and released to the exterior; therefore, the light extraction efficiency of the LED is enhanced.

Light incident on an interface between the semiconductor film and air, a resin, or another surrounding medium at an angle equal to or greater than the critical angle is totally reflected, and cannot be extracted to the exterior. Light that cannot be extracted to the exterior is repeatedly reflected within the semiconductor film and is weakened. The intensity of light propagated within the semiconductor film diminishes exponentially in relation to the propagation distance (light path length). For example, the refractive index of an AlGaInP-based semiconductor film is 3.3, and in an instance in which this semiconductor film is sealed using a resin having a refractive index of 1.5, the critical angle will be 27°, the reflectivity at the interface between the semiconductor film and the resin will be about 15%, and light that can be extracted to the exterior will be limited to about 4.5%.

There is known a light extraction structure formed by roughening the light-extraction surface of a semiconductor film. According to this structure, light heading towards the light-extraction surface is scattered and diffracted by the uneven section of the semiconductor film surface, the amount of light totally reflected by the interface between the light-extraction surface and the surrounding medium can be reduced, and it becomes possible to enhance the light extraction efficiency.

There is also known a configuration in which, in a so-called vertical-type light-emitting element in which an electrode is provided to each of an upper surface and a lower surface of a semiconductor film and a current is passed in the thickness direction of the semiconductor film, the electrode on the upper-surface side and the electrode on the lower-surface side are arranged so that the electrodes do not overlap each other when projected onto a projection surface parallel to a principal surface of the semiconductor film. An electrode configuration of such description is called a "counter-electrode layout." According to an electrode configuration of such description, spreading of current in the direction of the principal surface of the semiconductor film is promoted, and it is possible to enhance the uniformity of the current density distribution and the emission brightness distribution. The "counter-electrode layout" is normally used in combination with the above-mentioned laminated structure.

There are techniques disclosed, e.g., in Japanese Patent Kokai No. 2007-227895 (Patent literature 1), Japanese Patent Kokai No. 2008-60331 (Patent Literature 2), and Japanese Patent Kokai No. 2010-192709 (Patent Literature 3).

SUMMARY OF THE INVENTION

In a semiconductor light-emitting element having a laminated structure such as that mentioned above, the thickness of the semiconductor film is small, being normally equal to or less than 20 μm; therefore, current crowding readily occurs, and in particular, the electrostatic damage resistance against reverse surge is low. If the surface of the semiconductor film is subjected to an etching treatment, or a photonic crystal or another light extraction structure is otherwise formed, the thickness of the semiconductor film contributing towards spreading of the current is further decreased, and the electrostatic damage resistance is therefore further reduced. Although a counter-electrode layout tends to promote spreading of the current within the semiconductor film and enhance the electrostatic damage resistance, this effect is insufficient.

An example of effective means for enhancing the electrostatic damage resistance includes having an electrode configuration in which it is possible to avoid localized current crowding when a surge voltage is applied. In such a case, it is important to minimize any reduction in the light-emitting efficiency and reduction in light output during a light-emitting action. For example, in an instance in which the cover ratio of a surface electrode formed on the light-extraction surface is increased, a reduction in light output is unavoidable. Also, light generated directly below a power supply pad (bonding pad) to which a bonding wire is connected is blocked by the power supply pad, and cannot be extracted to the exterior with ease. Therefore, when a current is channeled directly below the power supply pad and light is generated directly below the power supply pad, the light extraction efficiency is reduced. It is preferable that the electrostatic damage resistance is enhanced without being accompanied by a reduction in light output and a reduction in light extraction efficiency of such description.

With the aforementioned circumstances in view, an object of the invention is to provide a semiconductor light-emitting element in which the electrostatic damage resistance can be enhanced while avoiding any reduction in efficiency or reduction in light output during a light-emitting action.

According to an aspect, a semiconductor light-emitting element includes a support substrate, a semiconductor film including a light-emitting layer provided on the support substrate, a surface electrode provided on a light-extraction-surface-side surface of the semiconductor film, and a light-reflecting layer provided between the support substrate and the semiconductor film, forming a light-reflecting surface on a surface bordering the semiconductor film, wherein the surface electrode includes a first electrode piece forming an ohmic contact with the semiconductor film, and a second electrode piece electrically connected to the first electrode piece, the second electrode piece adapted for forming a Schottky contact with the semiconductor film and forming a barrier inhibiting a forward current in the semiconductor film, the light-reflecting layer includes a reflection electrode, the reflection electrode including a third electrode piece forming an ohmic contact with the semiconductor film, and a fourth electrode piece electrically connected to the third electrode piece, adapted for forming an ohmic contact with the semiconductor film, and arranged opposite the second electrode piece, the first electrode piece and the third electrode piece are arranged so as to not overlap when projected onto a projection surface parallel to a principal surface of the semiconductor film, and the shortest distance, in a direction of a principal surface of the semiconductor film, between the first electrode piece and the fourth electrode piece, is greater than the shortest distance, in a direction of a principal surface of the semiconductor film, between the first electrode piece and the third electrode piece.

According to another aspect, a semiconductor light-emitting element includes a support substrate, a semiconductor film including a light-emitting layer provided on the support substrate, a surface electrode provided on a light-extraction-surface-side surface of the semiconductor film, and a light-reflecting layer provided between the support substrate and the semiconductor film, forming a light-reflecting surface on a surface bordering the semiconductor film, wherein the surface electrode includes a first electrode piece for forming an ohmic contact with the semiconductor film, and a second electrode piece electrically connected to the first electrode piece and adapted for forming an ohmic contact with the semiconductor film, the light-reflecting layer includes a reflection electrode, the reflection electrode including a third electrode piece forming an ohmic contact with the semiconductor film, and a fourth electrode piece electrically connected to the third electrode piece, arranged opposite the second electrode piece, and adapted for forming a Schottky contact with the semiconductor film and forming a barrier inhibiting a forward current in the semiconductor film, the first electrode piece and the third electrode piece are arranged so as to not overlap when projected onto a projection surface parallel to a principal surface of the semiconductor film, and the shortest distance, in a direction of a principal surface of the semiconductor film, between the third electrode piece and the second electrode piece is greater than the shortest distance, in a direction of a principal surface of the semiconductor film, between the third electrode piece and the first electrode piece.

According to the semiconductor light-emitting element of the invention, current is prevented from channeling into a region directly below a power supply pad during a light-emitting action, and a current path is formed between the second electrode piece and the fourth electrode piece during application of a reverse voltage; therefore it becomes possible to enhance the damage resistance against a reverse electrostatic surge while avoiding any reduction in light extraction efficiency or reduction in light output during a light-emitting action.

DETAILED DESCRIPTION OF PREFERRED EMBODIMENTS

Figure 1:
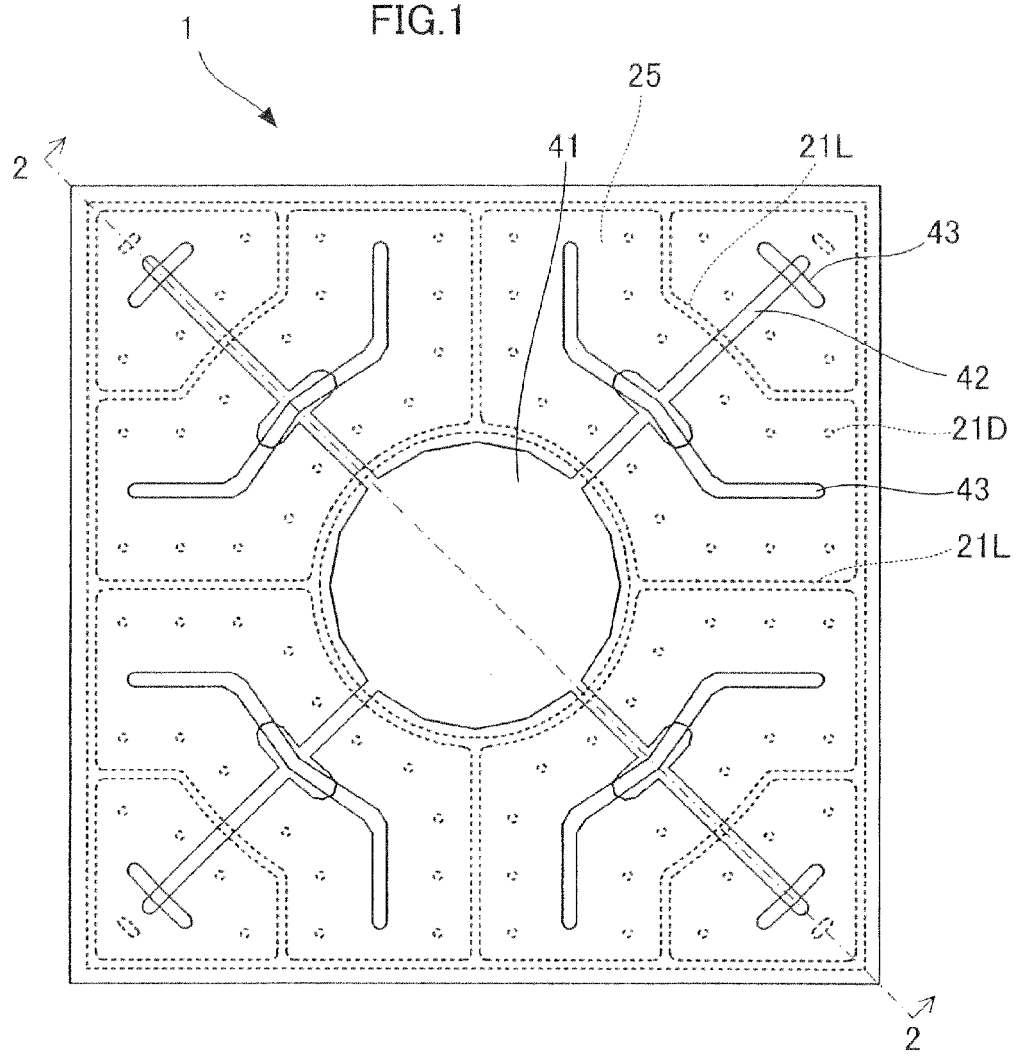
FIG. 1 is a top view showing the configuration of a semiconductor light-emitting element according to a first embodiment of the invention.

Embodiments of the invention will now be described with reference to the accompanying drawings. In the drawings referred to below, constituent elements and portions that are substantively identical or equivalent are affixed with identical reference numerals.

First Embodiment

Figure 2:
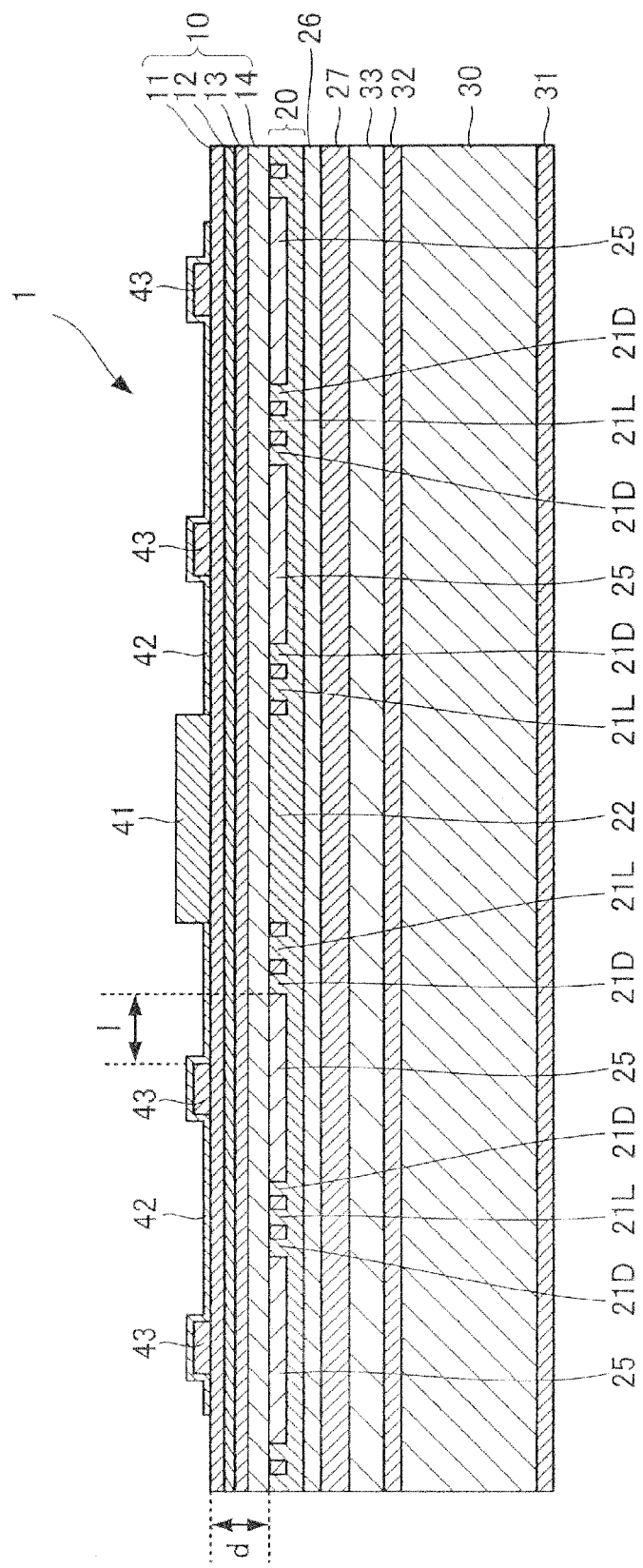
FIG. 2 is a cross-section view along line 2-2 in FIG. 1.

FIG. 1 is a top view showing the configuration of a semiconductor light-emitting element 1 according to a first embodiment of the invention, and FIG. 2 is a cross-sectional view along line 2-2 in FIG. 1. In FIG. 1, surface electrodes provided to the light-extraction-surface side are indicated by solid lines, and reflection electrodes provided to the light-reflecting-surface side are indicated by broken lines.

The semiconductor light-emitting element 1 has a square principal surface measuring, e.g., 300 μm on a side, and has a "laminated" structure in which a semiconductor film 10 and a support substrate 30 are joined with a light-reflecting layer 20 interposed therebetween. The semiconductor film 10 is configured by layering, in sequence from the light-extraction-surface side, an n-type clad layer 11, a light-emitting layer 12, a p-type clad layer 13, and a p-type contact layer 14. The n-type clad layer 11 is configured by layering, e.g., a layer made from Si-doped $(Al_{0.6}Ga_{0.4})_{0.5}In_{0.5}P$ having a thickness of 2.5 μm and a layer made from Si-doped $Al_{0.5}In_{0.5}P$ having a thickness of 0.5 μm. The light-emitting layer 12 has a multiple quantum well structure configured, e.g., by layering 15 repetitions of a pair comprising a well layer made from $(Al_{0.1}Ga_{0.9})_{0.5}In_{0.5}P$ having a thickness of 20 nm and a barrier layer made from $(Al_{0.5}Ga_{0.5})_{0.5}In_{0.5}P$ having a thickness of 10 nm. The p-type clad layer 13 comprises, e.g., Mg-doped $Al_{0.5}In_{0.5}P$ having a thickness of 0.5 μm. The p-type contact layer 14 comprises, e.g., Mg-doped GaP having a thickness of 1.5 μm. The composition ratio of each of the layers is not limited to those mentioned above, and can be modified as appropriate.

A surface of the n-type clad layer 11 that corresponds to the light-extraction surface is provided with surface electrodes comprising light-reflecting-surface side ohmic electrodes (first electrode pieces) 43 forming an ohmic contact with the semiconductor film 10, a power supply pad (bonding pads, second electrode pieces) 41 to which a bonding wire is connected, and wire electrodes 42 for electrically connecting the power supply pad 41 and the ohmic electrodes 43. The power supply pad 41 and the wire electrodes 42 comprise a material forming a Schottky contact with the n-type clad layer 11. The height of the Schottky barrier is higher than a forward voltage VF, including the wire resistance, at which a current starts to flow through the ohmic electrodes 43, and is equal to or greater than 0.2 V and preferably equal to or greater than 0.5 V. Au, Al, Ag, Cu, Fe, Ni, Pd, Pt, Mo, Ta, Ti, W, or a nitride thereof (e.g., TaN, WN) or a silicide thereof (e.g., WSi, TaSi) can be used for the material forming the power supply pad 41 or the wire electrodes 42. The power supply pad 41 may be configured by layering Au (having a thickness of approximately 1 μm) on the Schottky electrode material interposed by an intimate contact layer made from Ti or a similar substance in order to enhance wire bonding strength. The ohmic electrodes 43 comprise a material forming an ohmic contact with the n-type clad layer 11. The ohmic electrodes 43 can be configured by, e.g., layering a contact layer made from AuGeN (having a thickness of 300 nm), a barrier layer made from Ti/Ni (having a thickness of 200 nm), and a current-spreading layer made from Au (having a thickness of 200 nm) in the sequence listed. Other materials that can form an ohmic contact with the n-type clad layer 11 include, e.g., AuSn, AuGe, and AuSnNi.

Figure 3A:
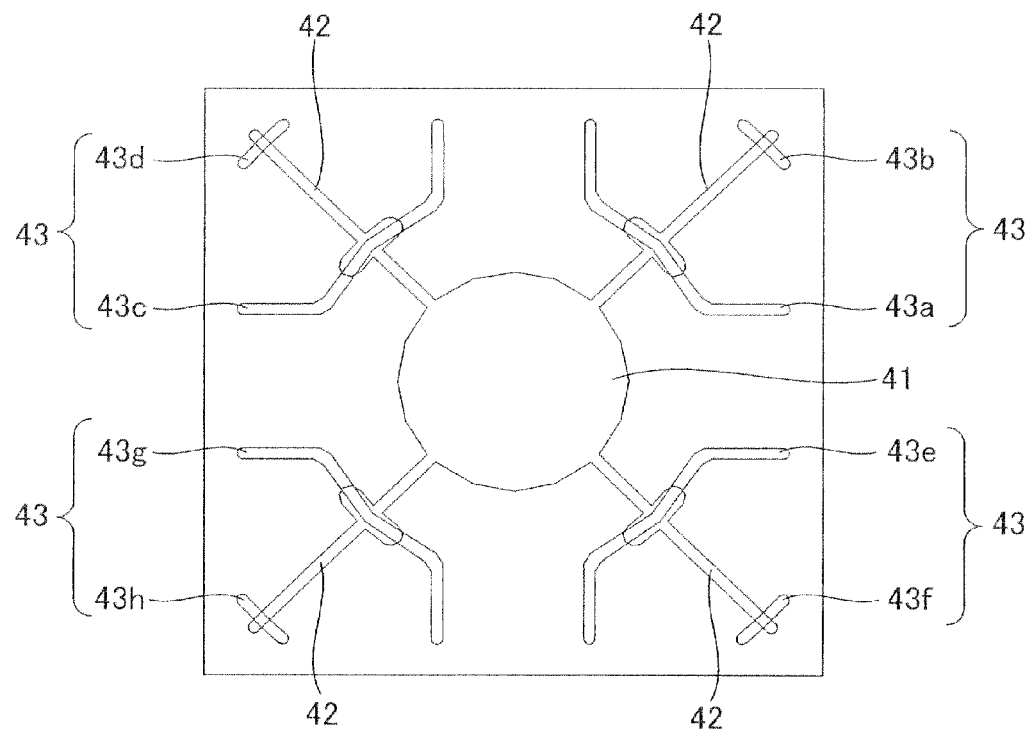
FIG. 3A is a top view showing the configuration of surface electrodes according to the first embodiment of the invention.

FIG. 3 shows only the power supply pad 41, the Ohmic electrodes 43, and the wire electrode 42 constituting surface electrodes. The power supply pad 41 has, e.g., a circular shape measuring 100 μm in diameter (7850 μm$^2$) and is arranged at the center of the light-extraction surface. The size of the power supply pad 41 is preferably equal to or greater than 2500 μm$^2$ and further preferably equal to or greater than 5000 μm$^2$. Linear wire electrodes 42 extending towards each corner section of the semiconductor light-emitting element 1 and having a width of about 5 μm are connected to the power supply pad 41. A linear ohmic electrode 43 having a width of about 5 μm is connected to each of the wire electrodes 42. The ohmic electrodes 43 comprise eight electrode pieces 43a through 43h dispersedly arranged on the corner sections, and slightly towards the center from the corner sections, of the semiconductor light-emitting element 1. The electrode pieces 43a through 43h of the ohmic electrodes 43 that have been dispersedly arranged are electrically connected to the power supply pad 41 via the wire electrodes 42. The surface electrodes, comprising the power supply pad 41, the wire electrodes 42, and the ohmic electrodes 43 describe a pattern having 4-fold rotational symmetry (i.e., overlaps when rotated by 90°) when the center of rotation is the center point of the semiconductor light-emitting element 1.

The light-reflecting layer 20 is provided adjacent to the p-type contact layer 14. The light-reflecting layer 20 includes a dielectric layer 25 and reflection electrodes, and forms a light-reflecting surface on a surface that borders the semiconductor film 10. The reflection electrodes comprise linear line electrodes 21L, insular dot electrodes 21D, and an opposing electrode 22 made from a material forming an ohmic contact with the p-type contact layer 14, e.g., AuZn. The opposing electrode 22 is an electrode piece arranged at a position opposite the power supply pad 41. The line electrodes 21L and the dot electrodes 21D constitute the third electrode piece of the invention, and the opposing electrode 22 constitutes the fourth electrode piece of the invention. The dielectric layer 25 is made from, e.g., $SiO_2$, and is formed near the interface with the p-type contact layer 14. The dielectric layer 25 is interposed between the line electrodes 21L, the dot electrodes 21D, and the opposing electrode 22; and separates each of the electrodes on a surface bordering the semiconductor film 10. In other words, the dielectric layer 25 demarcates the pattern of the reflection electrodes. The line electrodes 21L, the dot electrodes 21D, and the opposing electrode 22 are linked to each other below the dielectric layer 25, and are equipotential with respect to each other. $Si_3N_4$, $Al_2O_2$, or another transparent dielectric material other than $SiO_2$ can be used for the material forming the dielectric layer 25. Another material having a capability to form an ohmic contact with the p-type contact layer 14 and having a high light reflection performance can be used for the material forming the reflection electrodes.

Figure 3B:
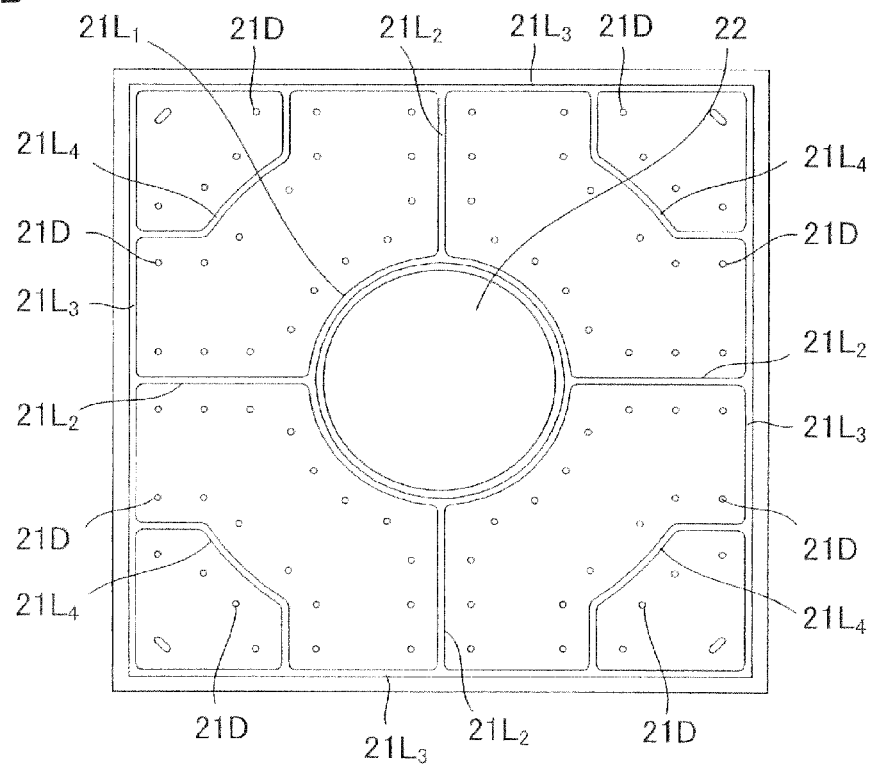
FIG. 3B is a top view showing the configuration of a reflection electrode according to an embodiment of the invention.

FIG. 3B shows only the line electrodes 21L, the dot electrodes 21D, and the opposing electrode 22 provided on the light-reflecting-surface side. The line electrodes 21L have a linear shape having a width of about 5 μm, and comprise a ring-shaped first portion $21L_1$ formed so as to surround the outer periphery of the opposing electrode 22; a substantially cross-shaped second portion $21L_2$ connecting to the first portion $21L_1$ and extending towards each side of the semiconductor light-emitting element 1; a third portion $21L_3$ connecting to the second portion $21L_2$ and extending along the outer edge of the semiconductor light-emitting element 1, and fourth portions $21L_4$ provided near each of the corner sections of the semiconductor light-emitting element 1 and connecting to the third portion $21L_3$ so as to straddle between two sides flanking each of the corner sections. The dot electrodes 21D have, e.g., a circular shape measuring about 5 μm in diameter, and are dispersedly arranged so as to follow each of the portions of the line electrodes 21L. Thus dispersedly arranging the dot electrodes 21D on the light-reflecting-surface side promotes current-spreading in the semiconductor film 10 even in an instance in which the semiconductor film 10 has a thin film thickness, and providing the line electrodes 21L in addition prevents current crowding occurring in the dot electrodes 21D.

The opposing electrode 22 is arranged directly below the power supply pad 41 on the light-extraction-surface side. The opposing electrode 22 has, e.g., a circular shape having a size identical to that of the power supply pad 41, but this is not provided by way of limitation. The size of the opposing electrode 22 may be larger than that of the power supply pad 41, and the shape of the opposing electrode 22 can also be modified as appropriate. The opposing electrode 22 is separated from the line electrodes 21L and the dot electrodes 21D on the surface bordering the semiconductor film 10 by the dielectric layer 25 provided so as to surround the outer periphery of the opposing electrode 22.

As shown in FIG. 1, the ohmic electrodes (first electrode pieces) 43 on the light-extraction-surface side and the line electrodes 21L and the dot electrodes 21D (third electrode pieces) on the light-reflecting-surface side are arranged so as to not overlap each other when projected onto a projection surface parallel to a principal surface of the semiconductor film 10, and constitute a "counter-electrode layout". Specifically, the line electrodes 21L and the dot electrodes 21D are arranged, on both sides flanking each electrode piece constituting the ohmic electrodes 43 on the light-extraction-surface side, so as to follow the electrode piece. The dielectric layer 25 is arranged directly below the ohmic electrodes 43 on the light-extraction-surface side. An electrode configuration of such description makes it possible to spread the current to a wide extent in the semiconductor film 10, even if the area of the ohmic electrodes 43 on the light-extraction-surface side is made smaller. In the present embodiment, the overall electrode pattern including the electrodes on the light-reflecting-surface side and the electrodes on the light-extraction-surface side has a 4-fold rotational symmetry when the center of rotation is the center point of the semiconductor light-emitting element 1. It is thereby possible to obtain an isotropic light distribution in an instance in which an illumination device is configured by combining the semiconductor light-emitting element 1 and lens and other components.

A barrier metal layer 26 is provided on the light-reflecting layer 20, and an intimate contact layer 27 is provided on the barrier metal layer 26. The barrier metal layer 26 can comprise a single layer or two or more layers containing, e.g., Ta, Ti, W, another metal having a high melting point, or a nitride thereof. The barrier metal layer 26 prevents Zn contained in the reflection electrodes from diffusing outwards, and prevents a eutectic adhesion material (e.g., AuSn) contained in an adhesion layer 33 from diffusing within the reflection electrodes. The intimate contact layer 27 contains a material, e.g., Ni, having high wettability with respect to the eutectic adhesion material contained in the adhesion layer 33.

The support substrate 30 is a Si substrate to which, e.g., a p-type impurity has been added at a high concentration to obtain electroconductivity. Ohmic metal layers 31, 32 made from, e.g., Pt, are formed on both sides of the support substrate 30. The adhesion layer 33 configured by sequentially layering Ti, Ni, and AuSn is provided on the ohmic metal layer 32. The support substrate 30 is affixed to the semiconductor film 10 by bonding between the adhesion layer 33 and the intimate contact layer 27. Ge, Al, Cu, or another electroconductive material other than Si can also be used for the material forming the support substrate 30.

Figure 4A:
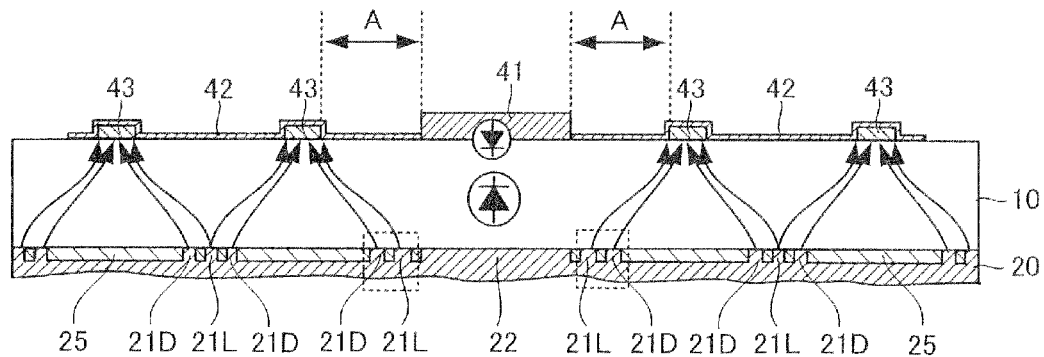
FIG. 4A is a cross-section view showing current paths, during a light-emitting action, in the semiconductor light-emitting element according to the first embodiment of the invention.

FIG. 4A shows paths of currents flowing in the semiconductor film 10 during a light-emitting action of the semiconductor light-emitting element 1 having the above-mentioned configuration. The currents flow from each of the line electrodes 21L and the dot electrodes 21D on the light-reflecting surface bordering the p-type contact layer 14 towards the ohmic electrode 43 on the light-reflecting surface positioned at the shortest distance therefrom. Since the ohmic electrodes 43, and the line electrodes 21L and the dot electrodes 21D, are arranged so as not to overlap each other when projected onto a projection surface parallel to a principal surface of the semiconductor film 10, the directions in which the currents flow have a component in the principal-surface direction of the semiconductor film 10 (lateral direction); therefore, current-spreading is promoted in the semiconductor film 10 having a relatively small film thickness, and the current density distribution can be made more uniform. The power supply pad 41 forms a Schottky contact with the semiconductor film 10, and a barrier oriented in a direction opposite the orientation of a diode formed by a p-n bonding in the semiconductor film 10 (i.e., a barrier acting to curb forward current) is formed therebetween. Therefore, no current flows from any of the line electrodes 21L, the dot electrodes 21D, and the opposing electrode 22 on the light-reflecting-surface side to the power supply pad 41. Specifically, no current is channeled into the region directly below the power supply pad 41 during the light-emitting action.

When a current flows in a region directly below the power supply pad 41, light is generated in a region that is blocked by the power supply pad 41 and that does not contribute towards light extraction, and the light extraction efficiency is reduced. In particular, in the semiconductor light-emitting element 1 of the present embodiment, the semiconductor film 10 has a relatively small film thickness; therefore, the reduction in the light extraction efficiency becomes prominent in an instance in which a current is channeled directly below the power supply pad 41. In the semiconductor light-emitting element 1 of the present embodiment, channeling of current directly below the power supply pad 41 is prevented by constituting the power supply pad 41 as a Schottky electrode, as well as by the configuration of each of the electrodes on the light-reflecting-surface side. Specifically, the opposing electrode 22 is arranged at a position at which the distance to the ohmic electrodes 43 on the light-extraction-surface side is greater than the distance relative to any of the line electrodes 21L and the dot electrodes 21D, and is separated, on the surface bordering the semiconductor film 10, from the line electrodes 21L and the dot electrodes 21D by the dielectric layer 25. In other words, the line electrodes 21L and the dot electrodes 21D (enclosed by broken lines in FIG. 4A) that are separated from the opposing electrode 22 on the surface bordering the semiconductor film 10 are arranged directly below region A between the power supply pad 41 and the adjacent ohmic electrodes 43. As a result of constituting the reflection electrodes as described above, almost no current flows, during the light-emitting action, from the opposing electrode 22 to the ohmic electrodes 43. Therefore, it is possible to almost completely eliminate current channeling into the region directly below the power supply pad 41.

Figure 4B:
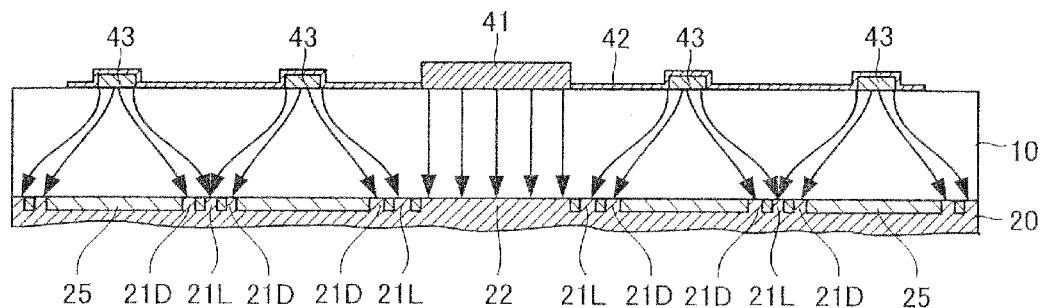
FIG. 4B is a cross-section view showing current paths during application of a reverse surge voltage.
Figure 4C:
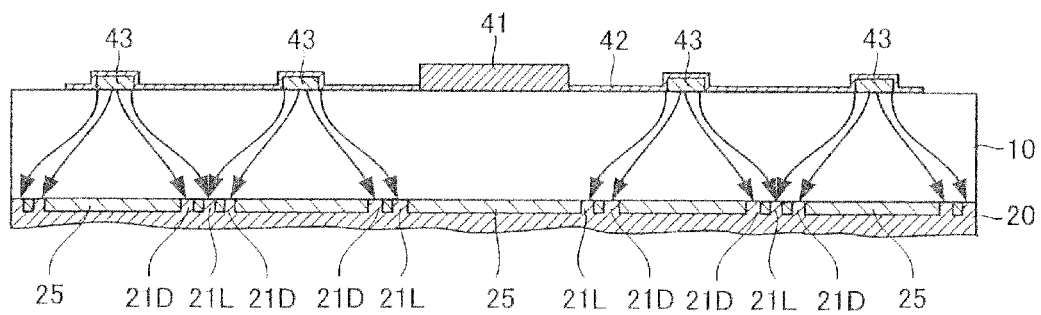
FIG. 4C is a cross-section view showing current paths, during application of a reverse surge voltage, in a semiconductor light-emitting element according to a comparative example.

FIG. 4B shows paths of currents flowing in the semiconductor film 10 during application of a reverse surge voltage of the semiconductor light-emitting element 1. When a voltage in a direction opposite that of the p-n bonding in the semiconductor film 10 is applied, a current flows from each of the ohmic electrodes 43 on the light-extraction-surface side to the line electrodes 21L and the dot electrodes 21D on the light-reflecting-surface side. Since the Schottky junction between the power supply pad 41 and the semiconductor film 10 is caused to be "biased" in the forward direction during application of a reverse surge voltage, almost no barrier exists between the power supply pad 41 and the semiconductor film 10, and current flows exponentially in relation to the voltage. Therefore, during application of the reverse surge voltage, a current flows from the power supply pad 41 to the opposing electrode 22. FIG. 4C shows paths of currents flowing in a semiconductor light-emitting element according to a comparative example that does not have an opposing electrode positioned opposite the power supply pad 41 when a reverse surge voltage is applied. In an instance in which an opposing electrode is not provided, the current paths comprise only the paths heading from the ohmic electrodes 43 on the light-extraction-surface side to the line electrodes 21L and the dot electrodes 21D on the light-reflecting-surface side. In such an instance, when a high voltage is applied, current crowding (current bunching) takes place in a path having the smallest resistance, and the electrostatic damage resistance becomes lower. Non-uniformity of resistance occurs due to, e.g., a slight misalignment in electrode arrangement, and it is difficult to completely eliminate non-uniformity of resistance. According to the semiconductor light-emitting element 1 of the present embodiment, during application of a reverse surge voltage, a current path is also formed between the power supply pad 41 and the opposing electrode 22, which have a relatively large area; therefore, current crowding is moderated and the electrostatic damage resistance is significantly enhanced. In particular, when a reverse surge voltage is applied, the distance between the power supply pad 41 and the opposing electrode 22 is shorter than the distance between the ohmic electrodes 43 and the line electrodes 21L and between the ohmic electrodes 43 and the dot electrodes 21D, and the current path between the power supply pad 41 and the opposing electrode 22 has a lower resistance in comparison to the current paths between the ohmic electrodes 43 and the line electrodes 21L and between the ohmic electrodes 43 and the dot electrodes 21D. Therefore it is possible to moderate current crowding and enhance the electrostatic damage resistance in an efficient manner. As shown in FIG. 2, the distance d between the power supply pad 41 and the opposing electrode 22 (i.e., the thickness of the semiconductor film 10) is smaller than the shortest distance $l_1$, in the direction of a principal surface of the semiconductor film 10, between the ohmic electrodes 43 on the light-extraction-surface side and the line electrodes 21L or the dot electrodes 21D on the light-reflecting-surface side ($l_1 > d$), the resistance in the surge current path formed between the power supply pad 41 and the opposing electrode 22 can be made smaller, and the effect of improving the electrostatic damage resistance can be further heightened.

Next, a description will be given for a method for manufacturing a semiconductor light-emitting element 1 having the above-mentioned configuration with reference to FIGS. 5 and 6.

(Forming a Semiconductor Film)

The semiconductor film 10 is formed by metalorganic chemical vapor deposition (MOCVD). An n-type GaAs substrate having a thickness of 300 μm, tilted by 15° in the [011] direction from a (100) surface, is used as a growth substrate 50 used for crystal growth of the semiconductor film 10. The n-type clad layer 11, configured by layering a layer made from Si-doped $(Al_{0.6}Ga_{0.4})_{0.5}In_{0.5}P$ having a thickness of 2.5 μm and a layer made from Si-doped $Al_{0.5}In_{0.5}P$ having a thickness of 0.5 μm, is formed on the growth substrate 50. The light-emitting layer 12 is formed on the n-type clad layer 11. The light-emitting layer 12 has a multiple quantum well structure configured by layering 15 repetitions of a pair comprising a well layer made from $(Al_{0.1}Ga_{0.9})_{0.5}In_{0.5}P$ having a thickness of 20 nm and a barrier layer made from $(Al_{0.5}Ga_{0.5})_{0.5}In_{0.5}P$ having a thickness of 10 nm. The Al composition ratio z of the well layer can be adjusted within a range of $0 \leq z \leq 0.4$ so as to match the emission wavelength. The p-type clad layer 13, having a thickness of 0.5 μm and comprising Mg-doped $Al_{0.5}Ga_{0.5}P$, is formed on the light-emitting layer 12. The Al composition ratio z of the n-type clad layer 11 and the p-type clad layer 13 can be adjusted within a range of $0.4 \leq z \leq 1.0$. The p-type contact layer 14, having a thickness of 1.5 μm, and comprising Mg-doped GaP, is formed on the p-type clad layer 13. It can be contained in the p-type contact layer 14 within a range in which light from the light-emitting layer 12 is not absorbed. The layers described above constitute the semiconductor film 10 (FIG. 5A). Phosphine ($PH_3$) is used as a group V ingredient, and organic metals comprising trimethylgallium (TMGa), trimethylaluminum (TMAl), and trimethylindium (TMI) are used as group III ingredients. Silane ($SiH_4$) is used as an ingredient for Si, which is an n-type impurity; and bis cyclopentadienyl magnesium ($Cp_2Mg$) is used as an ingredient for Mg, which is a p-type impurity. The growth temperature is 750 to 850° C. Hydrogen is used as a carrier gas, and the growth pressure is 10 kPa.

(Formation of Light-Reflecting Layer and Metal Layer)

Figure 5A:
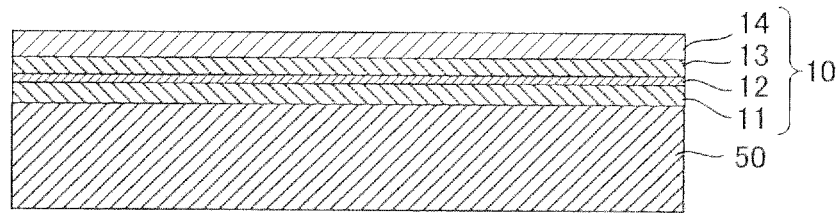
FIGS. 5A to 5D are cross-section views showing a method for manufacturing the semiconductor light-emitting element according to the first embodiment of the invention.
Figure 5B:
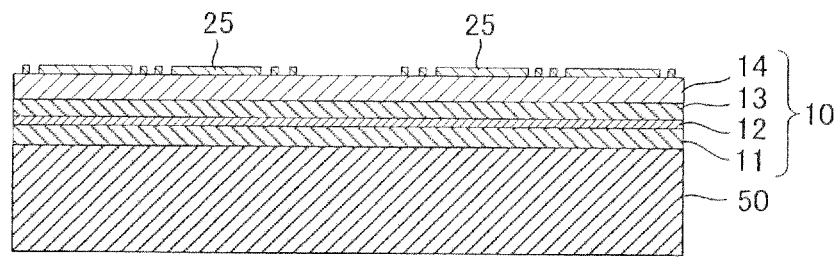

A $SiO_2$ film constituting the dielectric layer 25 is formed by plasma CVD on the p-type contact layer 14. The film thickness d of the $SiO_2$ film is set so that $d = m \cdot \lambda_0/4_n$ is satisfied when $\lambda_0$ represents the emission wavelength in a vacuum, n represents the diffraction index of the $SiO_2$ film, and m represents an integer. Here, $\lambda_0$ is set to 625 nm, n is set to 1.45, and m is set to 1, and the film thickness d of the dielectric layer 25 is set to 107 nm. Next, a resist mask is formed on the $SiO_2$ film, and etching is subsequently performed using buffered hydrofluoric acid (BHF), thereby applying a patterning on the $SiO_2$ film so as to correspond with the pattern of the line electrodes 21L, the dot electrodes 21D, and the opposing electrode 22. Openings are formed on portions from which the $SiO_2$ film has been removed, and the p-type contact layer 14 is exposed in the openings (FIG. 5B). Thermal CVD or sputtering can also be used as a method for forming the $SiO_2$ film. Dry etching can also be used as a method for etching the $SiO_2$ film. $Si_3N_4$, $Al_2O_3$, or another transparent dielectric material other than $SiO_2$ can be used for the material forming the dielectric layer 25.

Figure 5C:
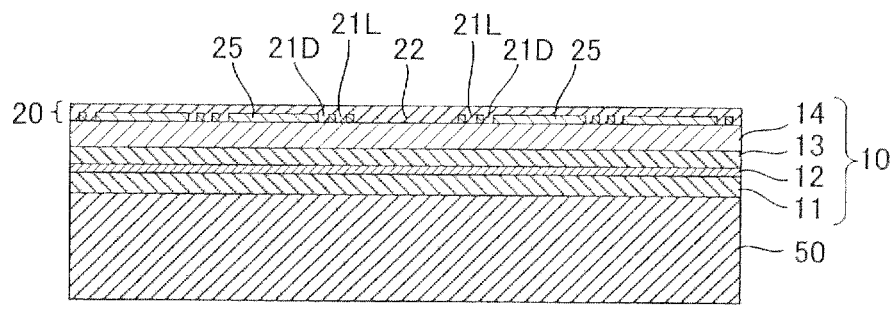

Next, a reflection electrode having a thickness of 300 nm, made from AuZn, is formed on the dielectric layer 25 using EB vapor deposition. The reflection electrode is in contact with the p-type contact layer 14 in the openings formed previously on the dielectric layer 25 using the etching treatment. The reflection electrode is divided by the dielectric layer 25 into the line electrodes 21L, the dot electrodes 21D, and the opposing electrode 22. The dielectric layer 25 and the reflection electrodes constitute the light-reflecting layer 20 (FIG. 5C).

Next, TaN (thickness: 100 nm), TiW (thickness: 100 nm), and TaN (thickness: 100 nm) are sequentially accumulated by sputtering on the light-reflecting layer 20, and the barrier metal layer 26 is formed. The barrier metal layer 26 may also comprise a single layer or two or more layers containing Ta, Ti, W, another metal having a high melting point, or a nitride thereof. Other than sputtering, EB vapor deposition can also be used to form the barrier metal layer 26. Then, heat treatment is performed under a nitrogen atmosphere of approximately 500° C. A satisfactory ohmic contact is thereby formed between the p-type contact layer 14 and the line electrodes 21L, the dot electrodes 21D, and the opposing electrode 22.

Figure 5D:
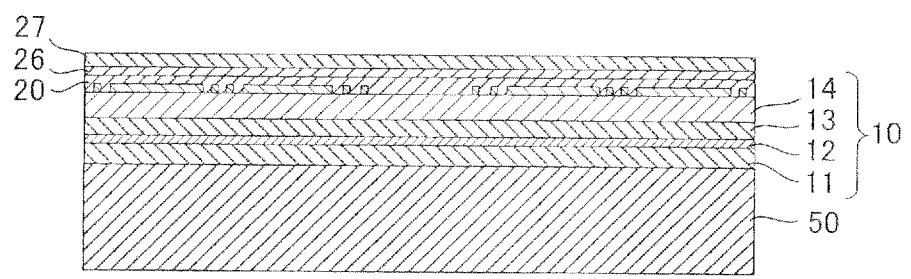

Next, Ni (thickness: 300 nm) and Au (thickness: 30 nm) are sequentially formed on the barrier metal layer 26 using EB vapor deposition, and the intimate contact layer 27 is formed. Resistance heat deposition or sputtering can be used to form the intimate contact layer 27 (FIG. 5D).

(Affixing the Support Substrate)

An Si substrate, to which a p-type impurity has been added to obtain electroconductivity, is used as the support substrate 30 for supporting the semiconductor film 10. The ohmic metal layers 31, 32 having a thickness of 200 nm, made from Pt, are formed on both sides of the support substrate 30 by EB vapor deposition. Next, Ti (thickness: 150 nm), Ni (thickness 100: nm), and AuSn (thickness 600: nm) are sequentially accumulated by sputtering on the ohmic metal layer 32 and the adhesion layer 33 is formed. The AuSn layer functions as a eutectic adhesion material. The Ni layer has a function of enhancing wetting performance with respect to the eutectic adhesion material. The Ti layer has a function of enhancing adhesion performance between Ni and the ohmic metal layer 32. The material forming the ohmic metal layers 31, 32 is not limited to Pt; another material that can form an ohmic contact with the Si substrate, e.g., Au, Ni, or Ti, can be used. The support substrate 30 may also comprise another material having electroconductivity and a high thermal conductivity, e.g., Ge, Al, or Cu.

Figure 6A:
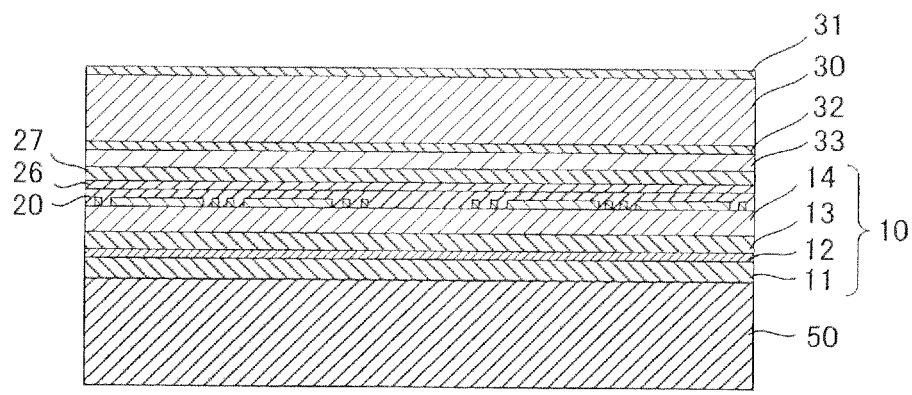
FIGS. 6A to 6C are cross-section views showing a method for manufacturing the semiconductor light-emitting element according to the first embodiment of the invention.

The semiconductor film 10 and the support substrate 30 are affixed by thermal compression. The intimate contact layer 27 on the semiconductor-film 10 side and the adhesion layer 33 on the support-substrate 30 side are brought into intimate contact and held for 10 minutes under a nitrogen atmosphere at 1 MPa and 330° C. The eutectic adhesion material (AuSn) contained in the adhesion layer 33 on the support-substrate 30 side melts, and forms AuSnNi with the intimate contact layer 27 (Ni/Au) on the semiconductor-film 10 side, whereby the support substrate 30 and the semiconductor film 10 are affixed to each other (FIG. 6A).

(Removing the Growth Substrate)

Figure 6B:
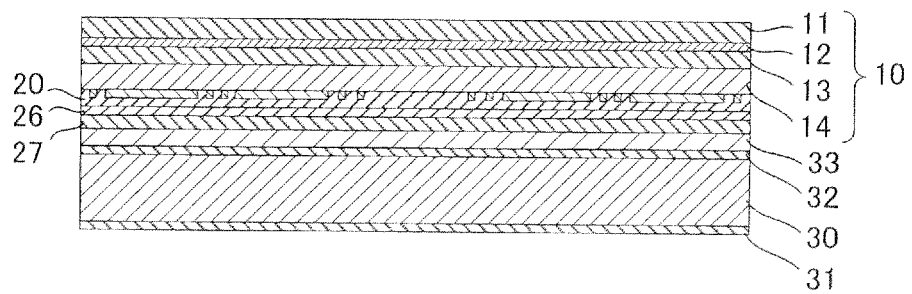

The growth substrate 50 used for crystal growth of the semiconductor film 10 is removed by wet etching using a mixture of ammonia water and hydrogen peroxide water. Dry etching, mechanical polishing, chemical mechanical polishing (CMP), or a combination of the above may also be used as a method for removing the growth substrate 50 (FIG. 6B).

(Forming the Light Extraction Structure)

A photonic crystal is formed, as a light extraction structure for enhancing the light extraction efficiency, on the surface of the n-type clad layer 11 that has been revealed by the growth substrate being removed. A resist mask (not shown) having an artificial periodic structure is formed by photolithography on the n-type clad layer 11, and dry etching is performed on the surface of the n-type clad layer through the resist mask, whereby a photonic crystal comprising a plurality of conical protrusions is formed on the surface of the n-type clad layer 11. The conical protrusions are formed in a triangular grid arrangement at a period of 500 nm, a height of 600 nm, and an aspect ratio of 1.2. EB lithography, an EB drawing device, nanoimprinting, laser exposure, or a similar method can also be used for patterning the resist mask. Each of the protrusions constituting the photonic crystal may be in the shape of a circular cylinder, a pyramid, a prism, or the like, with a period in the range of 300 nm to 1000 nm and an aspect ratio of 0.7 to 1.5. A light extraction structure may also be formed by roughening the surface of the n-type clad layer 11 by wet etching or another method, instead of using a photonic crystal.

(Forming Light-Reflecting-Surface Side Electrodes)

Figure 6C:
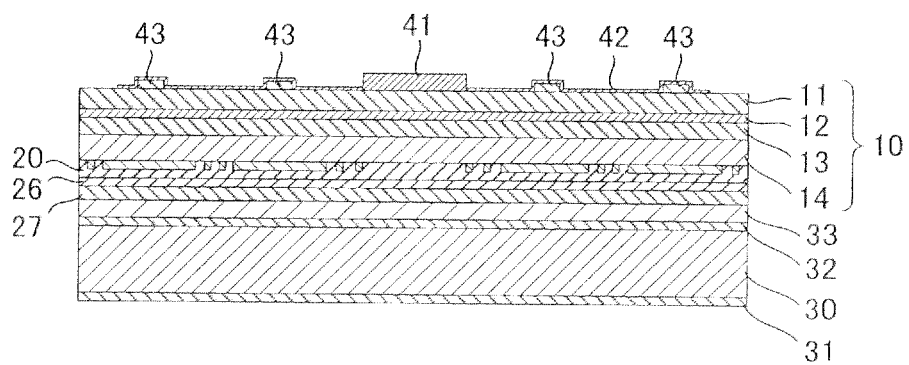

The ohmic electrodes 43, the power supply pad 41, and the wire electrodes 42 are formed on the surface of the n-type clad layer 11. AuGeNi, which forms an ohmic contact with the n-type clad layer 11, is accumulated on the n-type clad layer 11 by EB vapor deposition; then, patterning is performed using the lift-off method and the ohmic electrodes 43 are formed. Next, Ti (thickness: 100 nm) forming a Schottky contact with the n-type clad layer 11 is accumulated on the n-type clad layer 11 by EB vapor deposition, and Au (thickness: 1.5 μm) is caused to further accumulate on the Ti. Then, patterning is performed using the lift-off method and the power supply pad 41 and the wire electrodes 42 are formed. AuGe, AuSn, AuSnNi, or another material can also be used as the material forming the ohmic electrodes 43. Au, Al, Ag, Cu, Fe, Ni, Pd, Pt, Mo, Ta, Ti, W, or a nitride thereof (e.g., TaN, WN) or a silicide thereof (e.g., WSi, TaSi) can also be used for the material forming the power supply pad 41 or the wire electrodes 42. Also, Au (thickness of about 1 μm) may be caused to accumulate on the above-mentioned material that can form a Schottky contact, with an intimate contact layer made from Ti or a similar material interposed therebetween, in order to enhance the wire bonding strength. Next, in order to promote formation of an ohmic contact between the n-type clad layer 11 and the ohmic electrodes 43, heat treatment is performed under a nitrogen atmosphere at 400° C. (FIG. 6C). The semiconductor light-emitting element 1 is completed through the steps described above.

Figure 7:
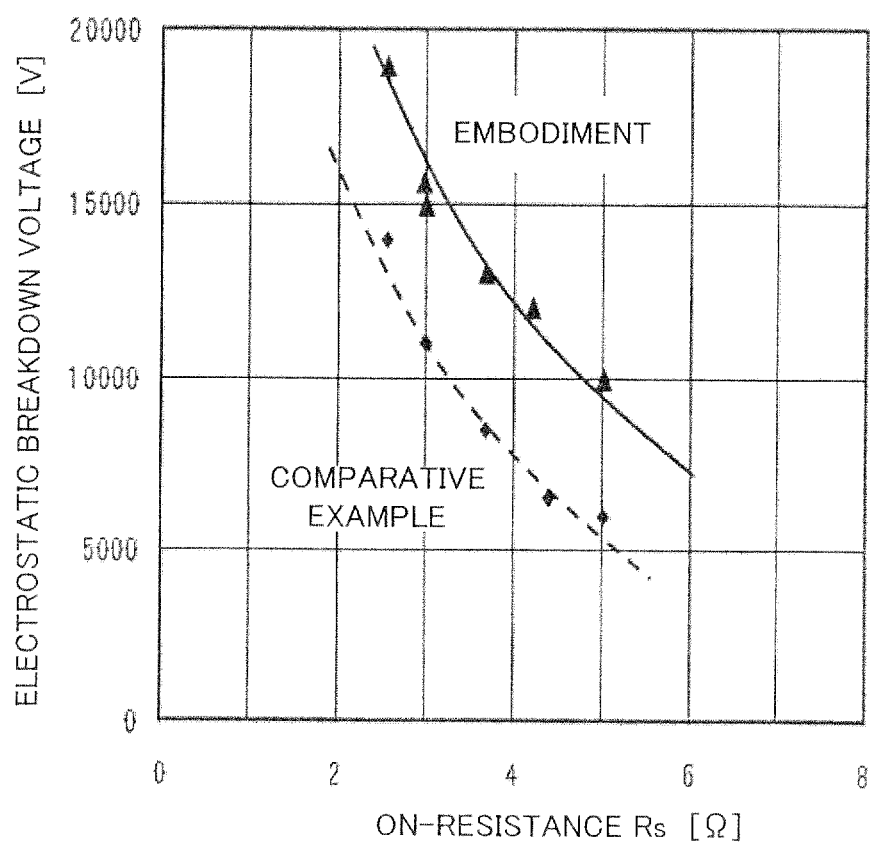
FIG. 7 shows results of an electrostatic discharge test performed on the semiconductor light-emitting element according to the first embodiment of the invention and a semiconductor light-emitting element according to a comparative example.

FIG. 7 shows results of an electrostatic discharge (ESD) test on a semiconductor light-emitting element 1 according to the embodiment of the invention (solid line) and a semiconductor light-emitting element according to a comparative example that does not have an opposing electrode that is positioned opposite the power supply pad 41 (broken line). The test was performed in compliance with JEDEC:JESD22-A114F. With regards to the test samples, a plurality of types of samples, in which the series resistance Rs has been varied by varying the horizontal-direction component of the inter-electrode distance between the ohmic electrodes on the light-extraction-surface side and the line electrodes and the dot electrodes on the light-reflecting-surface side, were used. In FIG. 7, the horizontal axis represents the series resistance Rs and the vertical axis represents the electrostatic destruction voltage. In both the samples of the embodiment and the comparative example, it was observed that there is a tendency for the electrostatic damage resistance to be enhanced by a greater degree with decreasing series resistance Rs. It was also observed that at an identical series resistance Rs, the semiconductor light-emitting element according to the present embodiment has an electrostatic damage resistance that is enhanced by about 3000 to 5000 V compared to a semiconductor light-emitting element according to the comparative example.

As can be seen from the above description, according to the semiconductor light-emitting element 1 of the present embodiment, it is possible, in a light-emitting element having a "laminated" structure in which the film thickness of the semiconductor film is relatively small, to obtain current-spreading that is uniform in the semiconductor film while minimizing the cover ratio of the surface electrodes. Therefore, it is possible to provide a light-emitting element in which unevenness in the brightness is absent and the light extraction efficiency is high.

The power supply pad (second electrode piece) 41 functions as a Schottky electrode against a forward current flowing in the semiconductor film 10, and the opposing electrode (fourth electrode piece) 22 arranged opposite the power supply pad 41 is arranged so that the shortest distance to the ohmic electrodes (first electrode pieces) 43 is greater than the shortest distance between the ohmic electrodes (first electrode pieces) 43 and the line electrodes 21L or the dot electrodes 21D (third electrode pieces), and the resistance between the opposing electrode 22 and the ohmic electrodes 43 is therefore higher than the resistance between the line electrodes 21L or the dot electrodes 21D and the ohmic electrodes 43. As a result, almost no current flows in the region directly below the power supply pad 41 during the light-emitting action, and no light is generated in this region. In the present embodiment, the semiconductor film 10 is formed so that the film thickness is substantially constant; therefore, the shortest distance, in the direction of a principal surface of the semiconductor film 10, between the opposing electrode 22 and the ohmic electrodes 43 (indicated by $l_2$ in FIG. 2) is greater than the shortest distance, in the direction of a principal surface of the semiconductor film 10, between the ohmic electrodes 43 and the line electrodes 21L or the dot electrodes 21D (indicated by $l_1$ in FIG. 2). The opposing electrode 22 is separated, on the surface bordering the semiconductor film 10, by the dielectric layer 25 from the line electrodes 21L and the dot electrodes 21D; therefore, it is possible to suppress a current flowing in the current paths between the ohmic electrodes 43 and the opposing electrode 22 during the light-emitting action compared to an instance in which the opposing electrode, the line electrodes 21L, and the dot electrodes 21D are formed in continuation. When a reverse surge voltage is applied, a current path is formed between the power supply pad 41 and the opposing electrode 22; therefore, current crowding is moderated, and it is possible to achieve an enhancement to the electrostatic damage resistance. Thus, according to the semiconductor light-emitting element 1 of the present embodiment, during the light-emitting action, channeling of current into the region directly below the power supply pad is prevented; and when a reverse surge voltage is applied, a current path having a lower resistance than the resistance in current paths between the ohmic electrodes 43 and the line electrodes 21L and between and the dot electrodes 21D is formed between the power supply pad 41 and the opposing electrode 22; therefore, it becomes possible to enhance the damage resistance against a reverse electrostatic surge while avoiding any reduction in the light extraction efficiency or reduction in light output during the light-emitting action. In particular, although in a semiconductor light-emitting element having a light-reflecting layer between a semiconductor film and a support substrate, the film thickness of the semiconductor film is relatively small, and the electrostatic damage resistance tends to be insufficient, according to the configuration of the present embodiment, it is possible to significantly improve the electrostatic damage resistance. It is also possible to obtain a sufficient electrostatic damage resistance even in an instance in which a photonic crystal or another light extraction structure is applied.

Second Embodiment

Figure 8A:
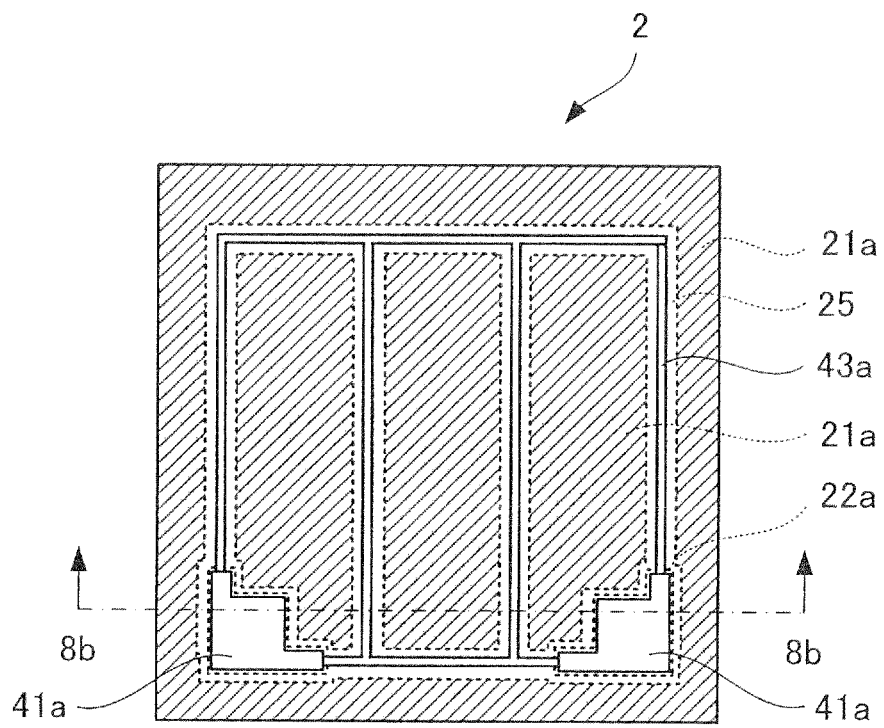
FIG. 8A is a top view showing the configuration of a semiconductor light-emitting element according to a second embodiment of the invention.
Figure 8B:
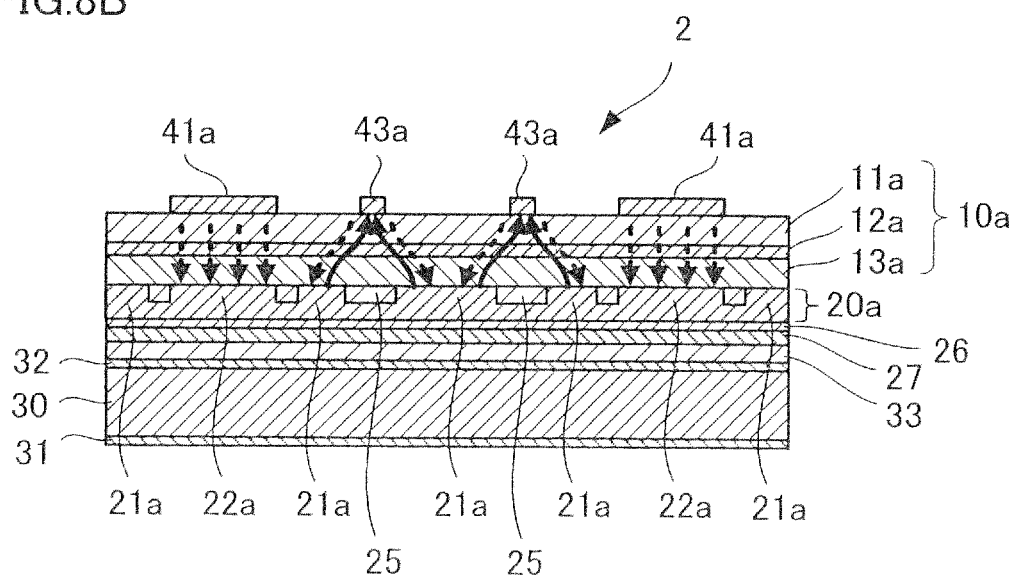
FIG. 8B is a cross-section view along line 8b-8b in FIG. 8A.

FIG. 8A is a plan view showing a configuration of a semiconductor light-emitting element 2 according to a second embodiment of the invention, and FIG. 8B is a cross-section view along line 8b-8b in FIG. 8A. In FIG. 8A, surface electrodes provided on the light-extraction-surface side are indicated by solid lines, and reflection electrodes provided on the light-reflecting-surface side are indicated by broken lines and hatching. The semiconductor light-emitting element 2 differs from the semiconductor light-emitting element 1 according to the above-mentioned first embodiment mainly with regards to the material forming the semiconductor layer and the electrode configuration. Other constituent portions are similar to those of the semiconductor light-emitting element 1 according to the first embodiment.

A semiconductor film 10a is made from a GaN-based semiconductor, and is configured by layering, in sequence from the light-extraction-surface side, an n-type clad layer 11a, a light-emitting layer 12a, and a p-type clad layer 13a. The n-type clad layer 11a comprises, e.g., Si-doped GaN having a thickness of 5 µm. The light-emitting layer 12a has a multiple quantum well structure configured, e.g., by layering 5 repetitions of a pair comprising a well layer made from $In_{0.35}Ga_{0.65}N$ having a thickness of 2 nm and a barrier layer made from GaN having a thickness of 14 nm. The p-type clad layer 13a is configured by layering, e.g., a layer made from Mg-doped $Al_{0.2}Ga_{0.8}N$ having a thickness of 40 nm and a layer made from Mg-doped GaN having a thickness of 100 nm.

A surface electrode comprising an ohmic electrode (first electrode piece) 43a forming an ohmic contact with the n-type clad layer 11a, and power supply pads (bonding pad, second electrode piece) 41a to which a bonding wire is connected, is provided to the surface of the n-type clad layer 11a, which represents the light-extraction surface. The power supply pads 41a can comprise a material forming a Schottky contact with the n-type clad layer 11a, e.g., Au, Al, Ag, Cu, Fe, Ni, Pd, Pt, Mo, Ta, Ti, W, or a nitride thereof (e.g., TaN, WN) or a silicide thereof (e.g., WSi, TaSi). The ohmic electrode 43a comprises a material forming an ohmic contact with the n-type clad layer 11a, e.g., by layering Ti (thickness: 1 nm), Al (thickness: 200 nm), and Au (thickness: 1000 nm) in the sequence listed. The power supply pads 41a are respectively arranged near two corner sections flanking one of the sides of the semiconductor light-emitting element 2. The ohmic electrode 43a has a linear shape connecting to the power supply pads 41a and extending on the surface of the n-type clad layer 11a, and supplies a current to each portion of the semiconductor film 10a.

A light-reflecting layer 20a provided adjacent to the p-type clad layer 13a comprises a dielectric layer 25 and reflection electrodes, and forms a light-reflecting surface on the surface bordering the semiconductor film 10a. The reflection electrodes comprise: an ohmic electrode (third electrode piece) 21a constituting a "counter-electrode layout" with the ohmic electrode 43a on the light-extraction-surface side; and opposing electrodes (fourth electrode pieces) 22a, each of which electrodes positioned opposite each of the two power supply pads 41a. The ohmic electrode 21a and the opposing electrodes 22a comprise a material forming an ohmic contact with the p-type clad layer 13a, e.g., Pt, Ag, or ITO.

The dielectric layer 25 is made from, e.g., $SiO_2$, and is provided on a surface layer portion of the light-reflecting layer 20a. The dielectric layer 25 has annular portions surrounding the outer periphery of the opposing electrodes 22a, and linear portions extending directly below the ohmic electrodes 43a so as to follow the ohmic electrodes 43a. On a surface bordering the semiconductor film 10a, the dielectric layer 25 divides the ohmic electrode 21a on the light-reflecting-surface side into a plurality of portions; and separates the opposing electrodes 22a from each of the portions of the ohmic electrode 21a. Each of the portions of the ohmic electrode 21a and the opposing electrodes 22a are linked to each other below the dielectric layer 25, and are equipotential with respect to each other.

The opposing electrodes 22a are arranged directly below the power supply pads 41a. The opposing electrodes 22a have, e.g., a size and shape identical to those of the power supply pads 41a. The opposing electrodes 22a are separated, on the surface bordering the semiconductor film 10a, from each of the portions of the ohmic electrode 21a by the annular dielectric layer 25 provided so as to surround the outer periphery of the opposing electrodes 22a.

The ohmic electrode 43a on the light-extraction-surface side and each of the portions of the ohmic electrode 21a on the light-reflecting-surface side are arranged so as to not overlap each other when projected onto a projection surface parallel to a principal surface of the semiconductor film 10a; and constitute a "counter electrode" layout. Specifically, the ohmic electrode 21a on the light-reflecting-surface side is arranged on both sides flanking the ohmic electrode 43a on the light-extraction-surface side so as to follow the ohmic electrode 43a; and the dielectric layer 25 is arranged directly below the ohmic electrode 43a.

In FIG. 8B, paths of currents flowing in the semiconductor film 10a during a light-emitting action are indicated by solid arrows, and paths of currents flowing in the semiconductor film 10a when a reverse surge voltage is applied are indicated by broken arrows. During the light-emitting action, currents flow from each of the portions of the ohmic electrode 21a on the light-reflecting-surface side bordering the p-type clad layer 13a towards the ohmic electrode 43a on the light-extraction-surface side positioned at the shortest distance therefrom. Since the two electrodes constitute a counter-electrode layout, the directions in which the currents flow have a component in the principal-surface direction of the semiconductor film 10a (lateral direction); therefore, current-spreading is promoted in the semiconductor film 10 having a relatively small film thickness, and the current density can be made more uniform. The power supply pads 41a form a Schottky contact with the semiconductor film 10a, and a barrier oriented in a direction opposite the orientation of a diode formed by a p-n bonding in the semiconductor film 10a (i.e., a barrier acting to curb forward current) is formed therebetween. Therefore, no current flows towards the power supply pads 41a during the light-emitting action. The opposing electrodes 22a are arranged at positions at which the shortest distance to the ohmic electrode 43a on the light-extraction-surface side (shortest distance in the principal-surface direction of the semiconductor film) is greater than the shortest distance between the ohmic electrode 21a on the light-reflecting-surface side and the ohmic electrode 43a on the light-extraction-surface side (shortest distance in the principal-surface direction of the semiconductor film); and are separated, on the surface bordering the semiconductor film 10a, from each of the portions of the ohmic electrode 21a by the dielectric layer 25. As a result of constituting the reflection electrodes as described above, almost no current flows, during the light-emitting action, from the opposing electrodes 22a to the ohmic electrode 43a. Therefore, it is possible to almost completely eliminate current flowing in a region directly below the power supply pads 41a during the light-emitting action. As a result, it is possible to prevent emission of light directly below the power supply pads 41a, and to heighten the light extraction efficiency.

When a voltage in a direction opposite that of the p-n bonding in the semiconductor film 10a is applied, a current flows from the ohmic electrode 43a on the light-extraction-surface side to the ohmic electrode 21a on the light-reflecting-surface side. The Schottky junction between the power supply pads 41a and the semiconductor film 10a is caused to be "biased" in the forward direction during application of a reverse surge voltage; therefore, almost no barrier exists between the power supply pads 41a and the semiconductor film 10a, and current flows exponentially in relation to the voltage. Therefore, during application of the reverse surge voltage, a current flows to the opposing electrodes 22a from the power supply pads 41a having a relative large area. During application of a reverse surge voltage, current paths having a resistance lower than the resistance between the ohmic electrode 43a on the light-extraction-surface side and the ohmic electrode 21a on the light-reflecting-surface side are formed between the power supply pads 41a and the opposing electrodes 22a; therefore, current crowding is moderated and the electrostatic damage resistance is significantly enhanced.

In the semiconductor light-emitting element 2 according to the second embodiment, the semiconductor film 10a comprises a GaN-based semiconductor, and the resistance of the p-type clad layer 13a is relatively high. Therefore, the area of the reflection electrodes connected to the p-type clad layer 13a is preferably larger than that in the semiconductor light-emitting element according to the first embodiment including a semiconductor film made from an AlGaInP-based semiconductor. Therefore, in the semiconductor light-emitting element 2 according to the second embodiment, the reflection electrodes are formed so as to cover a large portion of the p-type clad layer 13a to lower the forward voltage $V_F$. In a semiconductor light-emitting element 2 having an electrode configuration of such description, as with the instance according to the first embodiment, during the light-emitting action, channeling of current into the region directly below the power supply pad is prevented; and during application of a reverse surge voltage, current paths having a resistance lower than the resistance in current paths between the ohmic electrode 43a on the light-extraction-surface side and the ohmic electrode 21a on the light-reflecting-surface side are formed between the power supply pads 41a and the opposing electrodes 22a; therefore, it becomes possible to enhance the damage resistance against a reverse electrostatic surge while avoiding any reduction in the light extraction efficiency or reduction in light output during the light-emitting action.

Third Embodiment

Figure 9A:
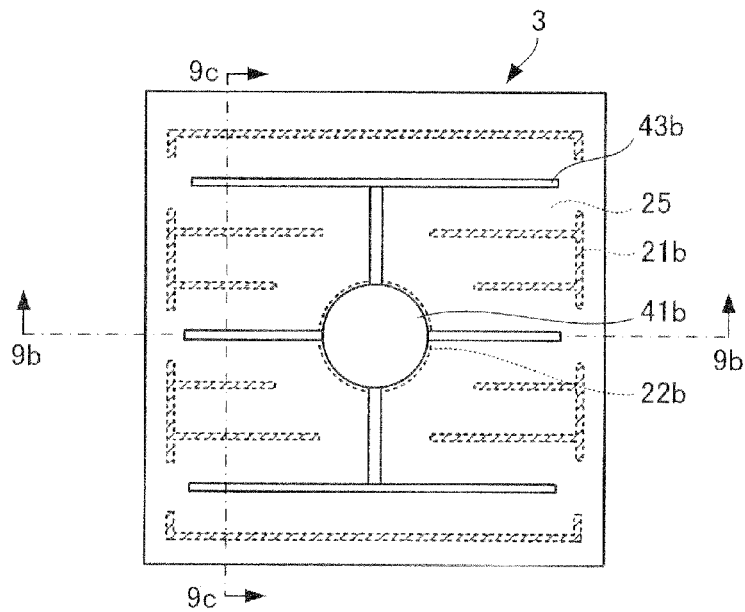
FIG. 9A is a top view showing the configuration of a semiconductor light-emitting element according to a third embodiment of the invention.
Figure 9B:
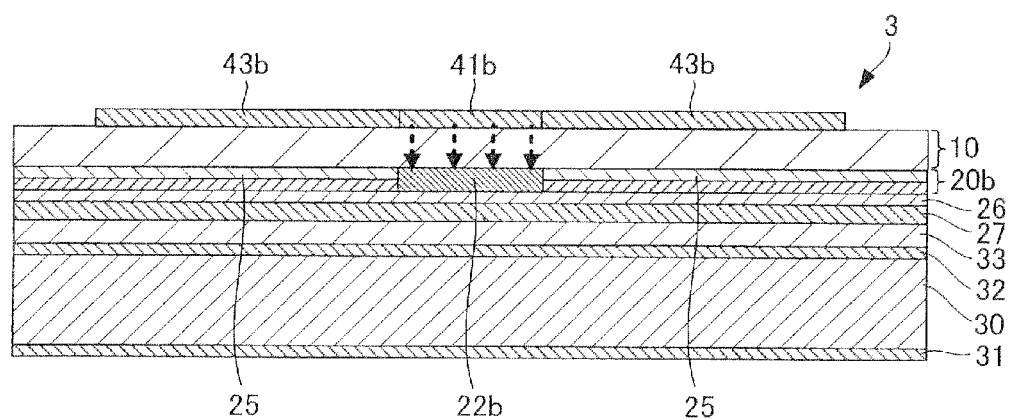
FIGS. 9B and 9C are cross-section views along line 9b-9b and line 9c-9c in FIG. 9A respectively.
Figure 9C:
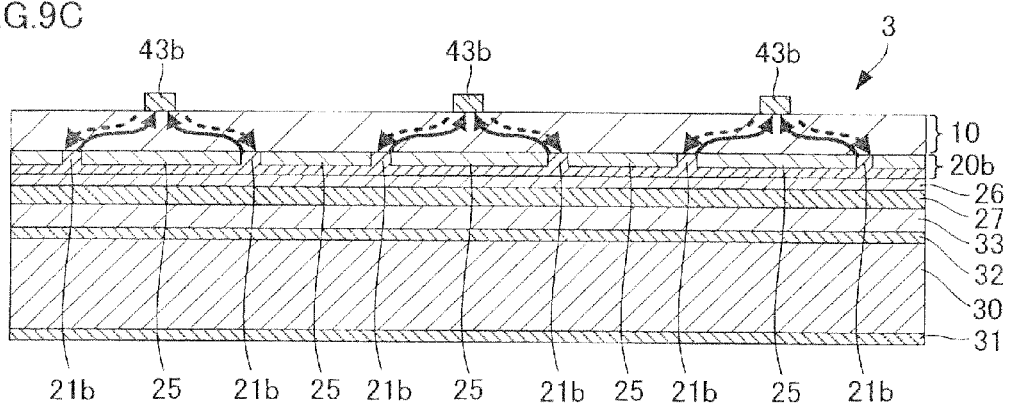

FIG. 9A is a top view showing the configuration of a semiconductor light-emitting element 3 according to a third embodiment of the invention; and FIGS. 9B and 9C are cross-sections views along line 9b-9b and line 9c-9c respectively in FIG. 9A. In FIG. 9A, surface electrodes provided to the light-extraction-surface side are indicated by solid lines, and reflection electrodes provided to the light-reflecting-surface side are indicated by broken lines and hatching. The semiconductor light-emitting element 3 differs from the semiconductor light-emitting element 1 according to the first embodiment principally in that while all portions constituting the surface electrodes provided to the light-extraction-surface side comprise a material forming an ohmic contact with the semiconductor film 10, the reflection electrodes provided on the light-reflecting-surface side have a portion comprising a material forming Schottky contact and a portion comprising a material forming an ohmic contact with the semiconductor film 10. Other constituent portions are similar to those of the semiconductor light-emitting element 1 according to the first embodiment.

The surface electrodes provided on the light-extraction surface (surface of the n-type clad layer) of the semiconductor film 10 made from an AlGaInP-based semiconductor comprise a power supply pad (first electrode piece) 41b and ohmic electrodes (second electrode pieces) 43b connected thereto. The power supply pad 41b is arranged at the center of a principal surface of the semiconductor film 10 and has a circular shape. The ohmic electrodes 43b are linear electrodes formed integrally with the power supply pad 41b so as to extend along the surface of the semiconductor film 10. The power supply pad 41b and the ohmic electrodes 43b both comprise a material forming an ohmic contact with the semiconductor film 10, e.g., AuGeNi. Configuring each of the portions constituting the surface electrodes using an identical material makes it possible to form the surface electrodes using one film-forming step using a single mask. In an instance, as with the first embodiment and the second embodiment, in which the surface electrodes comprise a portion forming a Schottky contact and a portion forming an ohmic contact with the semiconductor film 10, it is necessary, e.g., to form the ohmic electrode, and then form a wire electrode made from a material different from that of the ohmic electrode so as to cover the ohmic electrode. In such an instance, if the portion in which the wire electrode covers the ohmic electrode (i.e., a step portion) has poor coverage, there is a risk of the wire electrodes cracking or disconnecting and of the electrostatic damage resistance being reduced. In contrast, as with the present embodiment, constituting the surface electrodes from a single material makes it possible to avoid such a risk.

A light-reflecting layer 20b adjacent to the p-type clad layer of the semiconductor film 10 comprises a dielectric layer 25 and reflection electrodes, and form a light-reflecting surface on a surface bordering the semiconductor film 10. The reflection electrodes comprise ohmic electrodes (third electrode pieces) 21b on the light-reflecting-surface side constituting a counter-electrode layout with the ohmic electrodes 43b on the light-extraction-surface side, and an opposing electrode (fourth electrode piece) 22b arranged at a position opposite the power supply pad 41b. The ohmic electrodes 21b comprise a material forming an ohmic contact with the semiconductor film 10, e.g., AuZn. The opposing electrode 22b comprises a material forming a Schottky contact with the semiconductor film 10, e.g., WSi.

The dielectric layer 25 is made from, e.g., $SiO_2$; is interposed, on the surface bordering the semiconductor film 10, between the ohmic electrodes 21b and the opposing electrode 22b of the light-reflecting-surface side; and is configured to separate the ohmic electrodes 21b and the opposing electrode 22b. The opposing electrode 22b and each of the portions of the ohmic electrodes 21b are linked to each other below the dielectric layer 25, and are equipotential with respect to each other. The opposing electrode 22b is arranged directly below the power supply pad 41b on the light-extraction-surface side. The opposing electrode 22b has, e.g., a shape and size identical to those of the power supply pad 41.

The ohmic electrodes 43b on the light-extraction-surface side and the ohmic electrodes 21b on the light-reflecting-surface side are arranged so as to not overlap each other when projected onto a projection surface parallel to a principal surface of the semiconductor film 10; and constitute a "counter electrode" layout. Specifically, the ohmic electrodes 21b on the light-reflecting-surface side are linear electrodes arranged on both sides flanking the ohmic electrodes 43b on the light-extraction-surface side so as to extend along the ohmic electrodes 43b. The dielectric layer 25 stretches to a portion including a region directly below the ohmic electrodes 43b on the light-extraction-surface side.

Thus, in the semiconductor light-emitting element 3 according to the present embodiment, while each of the portions constituting the surface electrodes comprises a single material forming an ohmic contact with the semiconductor film 10, the reflection electrodes include portions forming an ohmic contact (ohmic electrodes 21b) and a portion forming a Schottky contact (opposing electrode 22b) with the semiconductor film. Reflection electrodes including portions made from materials that are different from each other can be formed, e.g., as follows. After the semiconductor film 10 is formed, an $SiO_2$ film constituting the dielectric layer 25 is formed as a film on the semiconductor film 10, and patterning corresponding to the reflection electrodes is applied on the $SiO_2$ film. Next, portions of the $SiO_2$ film other than the portion at which the opposing electrode 22b is to be formed are covered by a resist mask, and a material forming a Schottky contact with the semiconductor film 10 is formed as a film; then, the resist mask is removed, and the opposing electrode 22b is formed. Next, a material forming an ohmic contact with the semiconductor film 10 is formed as a film, and the ohmic electrodes 21b on the light-reflecting-surface side are formed.

In FIGS. 9B and 9C, paths of currents flowing in the semiconductor film 10 during a light-emitting action are indicated by solid arrows, and paths of currents flowing in the semiconductor film 10 when a reverse surge voltage is applied are indicated by broken arrows. During the light-emitting action, currents flow from each of the ohmic electrodes 21b on the light-reflecting-surface side towards the ohmic electrodes 43b on the light-extraction-surface side positioned at the shortest distance therefrom. Since the two types of electrodes constitute a counter-electrode layout, the directions in which the currents flow have a component in the principal-surface direction of the semiconductor film 10 (lateral direction); therefore, current-spreading is promoted in the semiconductor film 10 having a relatively small film thickness, and the current density can be made more uniform. The power supply pad 41b is arranged at a position sufficiently distant from the ohmic electrodes 21b on the light-reflecting-surface side, and is configured so as to form a Schottky contact with the semiconductor film 10; therefore, no current flows towards the power supply pad 41b during the light-emitting action. Specifically, an arrangement is present so that the shortest distance between the power supply pad 41b and the ohmic electrodes 21b on the light-reflecting-surface side (shortest distance in the principal-surface direction of the semiconductor film) is greater than the shortest distance between the ohmic electrodes 43b on the light-extraction-surface side and the ohmic electrodes 21b on the light-reflecting-surface side (shortest distance in the principal-surface direction of the semiconductor film). Therefore, during a light-emitting action, the resistance in current paths between the power supply pad 41b and the ohmic electrodes 21b on the light-reflecting-surface side becomes greater than the resistance in current paths between the ohmic electrodes 43b on the light-extraction-surface side and the ohmic electrodes 21b on the light-reflecting-surface side. Accordingly, it is possible to suppress any current flowing to the power supply pad 41b.

When a voltage in a direction opposite that of the p-n bonding in the semiconductor film 10 is applied, a current flows from the ohmic electrodes 43b on the light-extraction-surface side to the ohmic electrodes 21b on the light-reflecting-surface side. Since the Schottky junction between the power supply pad 41b and the semiconductor film 10 is caused to be "biased" in the forward direction during application of a reverse surge voltage, almost no barrier exists between the power supply pad 41b and the semiconductor film 10, and current flows exponentially in relation to the voltage. Therefore, during application of the reverse surge voltage, a current flows from the power supply pad 41b to the opposing electrode 22b having a relatively large area. During application of a reverse surge voltage, a current path having a resistance lower than the resistance of current paths between the ohmic electrodes 43b on the light-extraction-surface side and the ohmic electrodes 21b on the light-reflecting-surface side is formed between the power supply pad 41b and the opposing electrode 22b; therefore, current crowding is moderated and the electrostatic damage resistance is significantly enhanced.

In the semiconductor light-emitting element 3 according to the third embodiment, the ohmic electrodes 43b and the power supply pad 41b constituting the surface electrodes comprise an identical material. Therefore, the surface electrodes can be formed using a single film-forming step, and the power supply pad 41b and the ohmic electrodes 43b can be formed in continuation without overlap and without forming an interface on the semiconductor film. Specifically, the surface electrodes do not have a step portion, and are therefore less likely to crack or disconnect. Accordingly, it becomes possible to lower the risk of the electrostatic damage resistance being reduced. Also, as with the instance according to the first embodiment, during the light-emitting action, current is prevented from being channeled into a region directly below the power supply pad; and during application of a reverse surge voltage, a current path having a resistance lower than the resistance of current paths between the ohmic electrodes 43b on the light-extraction-surface side and the ohmic electrodes 21b on the light-reflecting-surface side is formed between the power supply pad 41b and the opposing electrode 22b; therefore, it becomes possible to enhance the damage resistance against a reverse electrostatic surge while avoiding any reduction in the light extraction efficiency or reduction in light output during the light-emitting action.

Fourth Embodiment

Figure 10A:
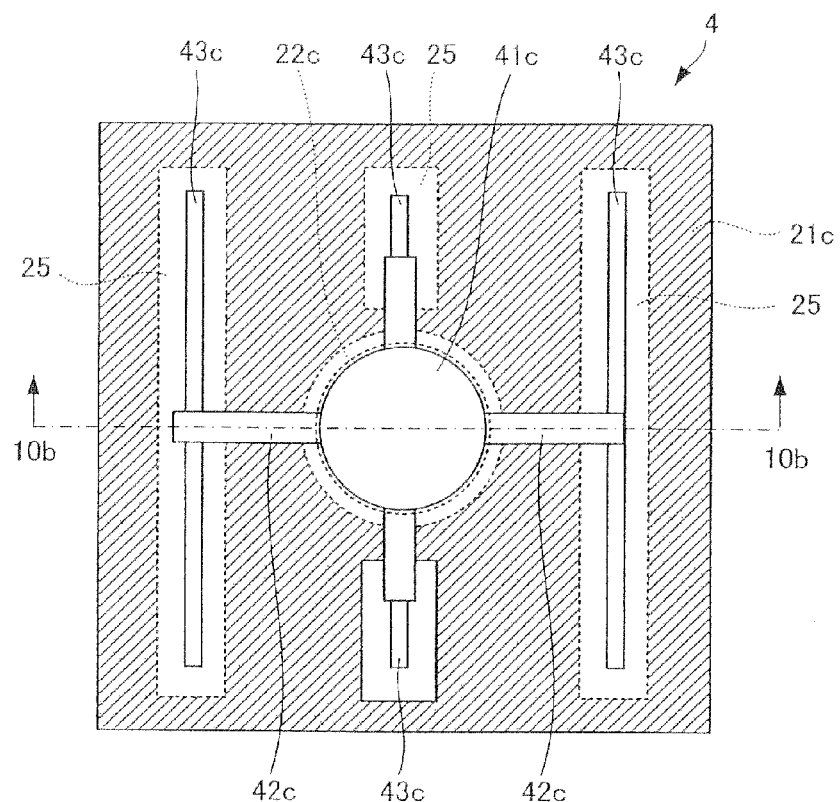
FIG. 10A is a top view showing the configuration of a semiconductor light-emitting element according to a fourth embodiment of the invention.
Figure 10B:
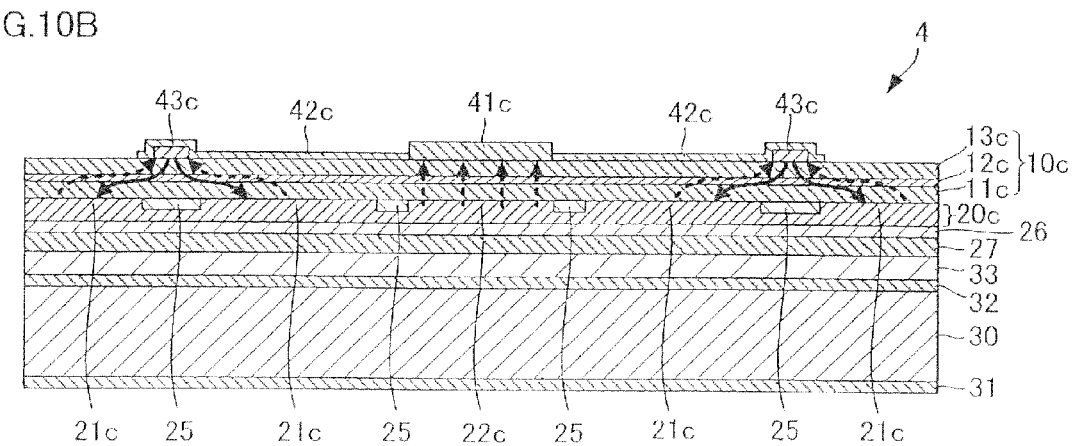
FIG. 10B is a cross-section view along line 10b-10b in FIG. 10A.

FIG. 10A is a top view showing a configuration of a semiconductor light-emitting element 4 according to a fourth embodiment of the invention, and FIG. 10B is a cross-section view along line 10b-10b in FIG. 10A. In FIG. 10A, surface electrodes provided on the light-extraction-surface side are indicated by solid lines, and reflection electrodes provided on the light-reflecting-surface side are indicated by broken lines and hatching. The semiconductor light-emitting element 4 differs from the semiconductor light-emitting element 1 according to the first embodiment principally in that a p-type clad layer is arranged on the light-extraction-surface side, and an n-type clad layer is arranged on the light-reflecting-surface side, of a semiconductor film 10c.

The semiconductor film 10c is made from an AlGaInP-based material, and is configured by layering, in sequence from the light-extraction-surface side, a p-type contact layer 14c, a p-type clad layer 13c, a light-emitting layer 12c, and a n-type clad layer 11c. The composition of each of the layers is identical to the semiconductor film according to the above-mentioned first embodiment.

Surface electrodes, comprising a power supply pad (bonding pad, first electrode piece) 41c to which a bonding wire is connected, ohmic electrodes (second electrode pieces) 43c on the light-reflecting-surface side forming an ohmic contact with the semiconductor film 10c, and wire electrodes 42c for connecting the power supply pad 41c to the ohmic electrodes 43c, are provided on the surface of the p-type contact layer 14c, which represents the light-extraction surface. The power supply pad 41c and the wire electrodes 42c comprise a material forming a Schottky contact with the p-type clad layer 13c, e.g., Ta, Ti, W, Pt, WSi, or Cu. The power supply pad 41c is arranged at the center of a principal surface of the semiconductor film 10c, and has a circular shape. The wire electrodes 42c are linear electrodes extending from the power supply pad 41c towards the four sides of the semiconductor film 10c and connecting to the ohmic electrodes 43c. The ohmic electrodes 43c comprise a material forming an ohmic contact with the p-type contact layer 14c, e.g., AuZn. The ohmic electrodes 43c have a linear shape extending along the surface of the p-type contact layer 14c, and supplies a current to each portion of the semiconductor film 10c.

A light-reflecting layer 20c provided adjacent to the n-type clad layer 11c comprises a dielectric layer 25 and reflection electrodes, and forms a light-reflecting surface on a surface bordering the semiconductor film 10c. The reflection electrodes comprise an ohmic electrode (third electrode piece) 21c on the light-reflecting-surface side constituting a counter-electrode layout with the ohmic electrodes 43c on the light-extraction-surface side, and an opposing electrode 22c (fourth electrode piece) positioned opposite the power supply pad 41c. The ohmic electrode 21c and the opposing electrode 22c comprise a material forming an ohmic contact with the n-type clad layer 11c, e.g., AuGeNi.

The dielectric layer 25 is made from, e.g., SiO$_2$, and is provided on a surface layer portion of the light-reflecting layer 20c. The dielectric layer 25 has an annular portion surrounding the outer periphery of the opposing electrode 22c and linear portions extending directly below the ohmic electrodes 43c so as to follow the ohmic electrodes 43c. The dielectric layer 25 separates the ohmic electrode 21c and the opposing electrode 22c from each other. The ohmic electrode 21c and the opposing electrode 22c are linked to each other below the dielectric layer 25, and are equipotential with respect to each other.

The opposing electrode 22c is arranged directly below the power supply pad 41c on the light-reflecting-surface side. The opposing electrode 22c has, e.g., a shape and size identical to those of the power supply pad 41c. The opposing electrode 22c is separated, on the surface bordering the semiconductor film 10c, from the ohmic electrode 21c by the ring-shaped dielectric layer 25 provided so as to surround the outer periphery of the opposing electrode 22c.

The ohmic electrodes 43c on the light-extraction-surface side and the ohmic electrode 21c on the light-reflecting-surface side are arranged so as to not overlap when projected onto a projection surface parallel to a principal surface of the semiconductor film 10c, and constitute a "counter electrode" layout. Specifically, the ohmic electrode 21c on the light-reflecting-surface side is arranged on both sides flanking the ohmic electrodes 43c on the light-extraction-surface side, and the dielectric layer 25 is arranged directly below the ohmic electrodes 43c.

In FIG. 10B, paths of currents flowing in the semiconductor film 10c during a light-emitting action are indicated by solid arrows, and paths of currents flowing in the semiconductor film 10c during application of a reverse surge voltage are indicated by broken arrows. During a light-emitting action, a current flows from each of the ohmic electrodes 43c on the light-extraction-surface side bordering the p-type clad layer 13c to the ohmic electrode 21c on the light-reflecting-surface side. Since the two electrodes constitute a counter-electrode layout, the directions in which the currents flow have a component in the principal-surface direction of the semiconductor film 10c (lateral direction); therefore, current-spreading is promoted in the semiconductor film 10c having a relatively small film thickness, and the current density can be made more uniform. The power supply pad 41c forms a Schottky contact with the semiconductor film 10c, and a barrier oriented in a direction opposite the orientation of a diode formed by a p-n bonding in the semiconductor film 10c (i.e., a barrier acting to curb forward current) is formed therebetween. Therefore, no current flows towards the power supply pad 41c during the light-emitting action. The opposing electrode 22c is arranged at a position at which the distance to the ohmic electrodes 43c on the light-extraction-surface side is further than any portion of the ohmic electrode 21c on the light-reflecting-surface side; and is separated, on a surface bordering the semiconductor film 10c, from the ohmic electrode 21c by the dielectric layer 25. Thus constituting the reflection electrodes results in almost no current flowing from the opposing electrode 22c to the ohmic electrodes 43c during the light-emitting action, and it therefore becomes possible to almost completely eliminate current flowing in the region directly below the power supply pad 41c during a light-emitting action.

Meanwhile, when a surge voltage in a direction opposite that of the p-n bonding in the semiconductor film 10c is applied, currents flow from the ohmic electrode 21c on the light-reflecting-surface side to the ohmic electrodes 43c on the light-extraction-surface side. Since the Schottky junction between the power supply pad 41c and the semiconductor film 10c is caused to be "biased" in the forward direction during application of a reverse surge voltage, almost no barrier exists between the power supply pad 41c and the semiconductor film 10c, and current flows exponentially in relation to the voltage. Therefore, during application of the reverse surge voltage, a current flows from the opposing electrode 22c to the power supply pad 41c having a relatively large area. During application of a reverse surge voltage, a current path having a resistance lower than the resistance of current paths between the ohmic electrodes 43c on the light-extraction-surface side and the ohmic electrode 21c on the light-reflecting-surface side is formed between the power supply pad 41c and the opposing electrode 22c; therefore, current crowding is moderated and the electrostatic damage resistance is significantly enhanced.

With regards to the surface electrodes provided on the light-extraction surface of the semiconductor film, the cover ratio cannot be made excessively high from the viewpoint of securing light extraction efficiency. Meanwhile, with regards to an AlGaInP-based semiconductor, it is generally difficult to form a structure in which the resistance of the n-type semiconductor is lowered and current is spread. This is because while on the p-side, it is possible to layer lattice-mismatched GaP having a low resistivity successively with respect to p-type AlGaInP, therefore making it possible to reduce the resistance on the p-side, the n-side is generally formed by layering from an n-type material on an n-type GaAs substrate, it is not possible to use lattice-mismatched GaP having low resistivity. Although it is possible to increase the film thickness to lower the resistance, it is undesireable because the crystallinity of an MQW, p-type semiconductor layer that is sequentially layered will be worse. Therefore, in an instance in which an n-type clad layer is arranged on the light-extraction-surface side, surface electrodes having a small area will be formed on the n-type clad layer, and it becomes difficult to cause the current to spread by a sufficient degree. Arranging an n-type clad layer on the light-reflecting-surface side as with the present embodiment makes it possible to cover a large portion of the surface of the n-type clad layer with the reflection electrodes, and makes it possible to promote current-spreading in the semiconductor film. In the semiconductor light-emitting element 4 according to the fourth embodiment having a configuration of such description, as with the instance of the first embodiment, during the light-emitting action, channeling of current into the region directly below the power supply pad is prevented; and during application of a reverse surge voltage, a current path having a resistance lower than the resistance in the current paths between the ohmic electrodes 43c on the light-extraction-surface side and the ohmic electrode 21c on the light-reflecting-surface side is formed between the power supply pad 41c and the opposing electrode 22c; therefore, it becomes possible to enhance the damage resistance against a reverse electrostatic surge while avoiding any reduction in light extraction efficiency or reduction in light output during a light-emitting action.

The semiconductor light-emitting element 4 having the above-mentioned configuration can be manufactured, e.g., by the following process. The semiconductor film 10c is formed on a GaAs substrate or another growth substrate using MOCVD or a similar method. The semiconductor film 10c is layered on the growth substrate in the sequence of n-type clad layer 11c, the light-emitting layer 12c, the p-type clad layer 13c, and the p-type contact layer 14c. Next, a temporary substrate made from Si, glass, or a similar material is affixed to the surface of the p-type contact layer 14c using a resin adhesive or a similar material. Next, the growth substrate is removed, and the n-type clad layer 11c is revealed. Next, a SiO₂ film constituting the light-reflecting layer 20c is formed on the n-type clad layer 11c and subjected to patterning, then ITO and Au are formed as films on the SiO₂ film and a reflection electrodes are formed. Although the reflection electrodes can also be formed using AuGeNi, AuSn, or a similar material, in such an instance, there is a risk of an alloy layer being formed and the reflectivity being reduced. Therefore, the reflection electrodes are preferably formed using ITO, which does not form an alloy layer. Then, a barrier metal layer and an intimate contact layer are formed on the light-reflecting layer, and a support substrate is affixed using the same procedure as that for the first embodiment. Next, the temporary substrate is removed and the surface of the p-type contact layer 14c is revealed. Next, the light-extraction-surface side ohmic electrodes 43c are formed on the surface of the p-type clad layer 13c, and then the power supply pad 41c and the wire electrodes 42c are formed.

In the above-mentioned embodiments, a surge current path that only functions (conducts) when a reverse voltage is applied is arranged directly below the power supply pad; however, a current path of such description can also be arranged in a single or a plurality of regions other than the region directly below the power supply pad. Specifically, a pair of electrodes that oppose each other interposed by a semiconductor film, one of the electrodes being a Schottky electrode, may be dispersedly arranged on the semiconductor film. Also, a semiconductor light-emitting device can be configured by interchanging, or combining as appropriate, the electrode configurations and the configurations of the semiconductor film shown in the above-mentioned embodiments. This application is based on Japanese Patent Application No. 2011-160060 which is incorporated herein by reference.

What is claimed is:

1. A semiconductor light-emitting element including:
    a support substrate;
    a semiconductor film including a light-emitting layer provided on said support substrate;
    a surface electrode provided on a light-extraction-surface-side surface of said semiconductor film; and
    a light-reflecting layer provided between said support substrate and said semiconductor film, forming a light-reflecting surface on a surface bordering said semiconductor film;
    wherein said surface electrode includes a first electrode piece forming an ohmic contact with said semiconductor film, and a second electrode piece electrically connected to said first electrode piece, the second electrode piece adapted for forming a Schottky contact with said semiconductor film and forming a barrier inhibiting a forward current in said semiconductor film;
    wherein said light-reflecting layer includes a reflection electrode, said reflection electrode including a third electrode piece forming an ohmic contact with said semiconductor film, and a fourth electrode piece electrically connected to said third electrode piece, adapted for forming an ohmic contact with said semiconductor film, and arranged opposite said second electrode piece;
    wherein said first electrode piece and said third electrode piece are arranged so as to not overlap when projected onto a projection surface parallel to a principal surface of said semiconductor film; and
    wherein a shortest distance, in a direction of a principal surface of said semiconductor film, between said first electrode piece and said fourth electrode piece, is greater than a shortest distance, in the direction of the principal surface of said semiconductor film, between said first electrode piece and said third electrode piece.

2. The semiconductor light-emitting element according to claim 1, wherein said second electrode piece is a power supply pad.

3. The semiconductor light-emitting element according to claim 1, wherein said light-reflecting layer includes a dielectric layer provided to a surface layer thereof; and said dielectric layer is provided, on a surface at which said light-reflecting layer borders said semiconductor film, between said third electrode piece and said fourth electrode piece.

4. The semiconductor light-emitting element according to claim 3, wherein said first electrode piece is dispersedly arranged on said principal surface, and electrically connected to said second electrode piece via a wire electrode; and said third electrode piece includes an electrode piece arranged directly below a region between said first electrode piece and said second electrode piece and separated from said fourth electrode piece by said dielectric layer on a surface bordering said semiconductor film.

5. The semiconductor light-emitting element according to claim 1, wherein a distance between said second electrode piece and said fourth electrode piece is smaller than the shortest distance, in the direction of the principal surface of said semiconductor film, between said first electrode piece and said third electrode piece.

6. The semiconductor light-emitting element according to claim 3, wherein the third electrode piece includes a linear line electrode extending on said light-reflecting surface, and a plurality of insular dot electrodes dispersedly arranged along said line electrode.

7. The semiconductor light-emitting element according to claim 3, wherein said first electrode piece has a linear shape extending on said light-extraction surface; and said dielectric layer has an annular portion and a linear portion, the annular portion surrounding an outer periphery of said fourth electrode piece, and the linear portion extending along said first electrode piece and directly below said first electrode piece.

8. The semiconductor light-emitting element according to claim 1, wherein said semiconductor film includes a layer made from AlGaInP, an n-type semiconductor layer being arranged on a light-reflecting-surface side, and a p-type semiconductor layer being arranged on said light-extraction-surface side.

* * * * *